United States Patent [19]
Kim

[11] Patent Number: 5,991,250
[45] Date of Patent: Nov. 23, 1999

[54] OPTICAL DISC RECORDING METHOD AND APPARATUS FOR RECORDING CLOCK STABILIZATION INFORMATION ON A PORTION OF A UNIT BLOCK ADJACENT A DISCONTINUOUS RECORDING POSITION

[75] Inventor: Dae Young Kim, Seoul, Rep. of Korea

[73] Assignee: LG Electronics, Inc., Seoul, Rep. of Korea

[21] Appl. No.: 08/898,868

[22] Filed: Jul. 23, 1997

[51] Int. Cl.$^6$ .................................................. G11B 7/00
[52] U.S. Cl. .............................................. 369/47; 369/48
[58] Field of Search ................................ 369/48, 47, 59, 369/275.3, 58, 54; 360/48, 50

[56] References Cited

U.S. PATENT DOCUMENTS

| | | | |
|---|---|---|---|
| 5,182,740 | 1/1993 | Mizokami et al. | 369/47 |
| 5,233,592 | 8/1993 | Suzuki et al. | 369/59 |
| 5,333,126 | 7/1994 | Fukuda et al. | 369/59 |
| 5,359,585 | 10/1994 | Tanoue et al. | 369/48 |
| 5,383,171 | 1/1995 | Mizokami et al. | 369/59 |
| 5,448,543 | 9/1995 | Mizokami et al. | 369/54 |
| 5,835,461 | 11/1998 | Kobayashi et al. | 369/48 |
| 5,848,050 | 12/1998 | Nagasawa et al. | 369/275.3 |

*Primary Examiner*—Thang V. Tran

[57] ABSTRACT

An optical disc recording method and apparatus which records a clock stabilization information additionally on a discontinuous recording position in the signal track of the optical disc on which a support signal in the soft sector system is preformatted. The method and apparatus records a clock stabilization information on a part of unit blocks adjacent to the discontinuous recording position in the signal track of the optical disc on which a support signal for dividing the signal track into unit blocks is preformatted in a separate area different from the signal track. Further, a user information is recorded on the remaining part of the unit blocks adjacent to the discontinuous recording position. Accordingly, the user information recorded on a position adjacent to the discontinuous recording position in the signal track of the optical disc can be stabbly reproduced, and a recording capacity of the optical disc can be improved.

44 Claims, 15 Drawing Sheets

RECORDING CLOCK

REPRODUCED CLOCK

REPRODUCED CLOCK

OPTICAL DISC RECORDING METHOD AND APPARATUS FOR RECORDING CLOCK STABILIZATION INFORMATION ON A PORTION OF A UNIT BLOCK ADJACENT A DISCONTINUOUS RECORDING POSITION

BACKGROUND OF THE INVENTION

1. Field of the Invention

This invention relates to a technique for recording an information onto an optical disc in which a support signal indicating the physical position of a signal track is preformatted on an area different from the signal track, and more particularly to an optical disc recording method which records an information onto an discontinuous recording position of the signal track and an apparatus thereof.

2. Description of the Prior Art

In the conventional optical disc, such as a compact disc, hereinafter referred simply to as "CD", and a digital versatile disc, hereinafter referred simply to as "DVD", a signal track on which an information is to be recorded is formed in the spiral or concentric shape. Also, in the optical disc, a support signal is preformatted such that the signal track can be accessed in a random basis. This support signal divides the signal track into unit storage areas having a constant size and indicates the physical position of these unit storage areas.

The support signal has been preformatted on the optical disc in the two methods, that is, in the hard sector system and the soft sector system. According to the former hard sector system, the support signal is preformatted on the optical disc by defining embossed pits in the partial area of the signal track of the optical disc. In an optical disc in which the support signal is preformatted in this way, as shown in FIG. 1, signal tracks in the concentric or spiral shape are divided into a constant size of sectors 14. Each of these sectors 14 consists of a sector identification signal portion 16 and a main information signal portion 18. The sector identification signal portion 16 includes a synchronous pattern, an address mark, a track number and a sector number, thereby to indicate a boundary portion with adjacent sectors and to be used as a support signal indicating the physical position of that sector. The support signal in such a hard sector system occupies a partial region of the signal track on which user information is otherwise recorded. This results in a recording capacity of the optical disc being reduced.

On the other hand, the support signal in the latter soft sector system is positioned within a separate area that different from the signal track of the optical area, that is, a so-called wobbled area, so that it is possible to make a recording capacity of the optical disc large. In an optical disc in which the support signal is preformatted in this soft sector system, as shown in FIG. 2, wobbled grooves 22 defined from the center to the circumference of the optical disc in the spiral or concentric shape, hereinafter referred to as "groove tracks", are wobbled in a certain period, and lands 20, hereinafter referred to as "land tracks", are arranged in parallel with the groove tracks 22 between the groove tracks 22. The support signal is preformatted on the wobbled portion in either side of the groove tracks, hereinafter referred to as "wobbled area".

A user information block recorded on the signal track of the optical disc in which the support signal in such a soft sector system is preformatted, consists of a user block identification portion and a user block information portion. This user block identification portion includes a synchronous pattern, an address mark, a track number and a block number, etc. similar to the support signal in the spare sector system. The user block identification portion configured in this way indicates the physical position of the signal track of the optical disc at the time of reproducing. Accordingly, the support signal in the soft sector system is mainly used in the case where the user information is recorded onto the optical disc.

Further, the support signal is preformatted on the optical disc in such a pattern that it is synchronized with a clock signal having a constant period, in order to represent a transfer rate of the user information, that is, the recording and reproducing speed. In other words, a constant period of clock signal is included in the support signal preformatted on the optical disc. Clock signals included in each of the user block identification portion and the sector identification signal portion in the hard sector system have the same period as bits of the user information while a clock signal included in the support signal in the soft sector system has a relatively large period compared with bits of the user information. That is to say, a reference clock signal included in the support signal in the soft sector system has a lower frequency in comparison to the user information bit. Owing to this, in the optical disc in which the support signal in the soft sector system is preformatted, the phase of the clock signal recorded on the signal track may be changed suddenly. If the phase of the clock signal is suddenly changed as mentioned above, then since a clock signal having a period different from bit of the user information is reproduced, a part of the user information blocks recorded on the signal track is not reproduced accurately. This phenomenon occurs at a recording position in the signal track of the optical disc recorded discontinuously, hereinafter referred to as "discontinuous recording position". Moreover, it occurs more frequently as the number of the information files recorded on the signal track of the optical disc increases. This discontinuous recording position appears in the case where the first information file is recorded in a range from the start position of the signal track to an optional position in the intermediate thereof and, after a certain time has lapsed, the second information file is recorded from the optional position, and in the case where a new information is overwritten to an optional position of the signal track on which an information was recorded.

In reality, as shown in FIG. 3, if the first user information was recorded in a region S1 (not shown) ranged from the left side of the signal track 20 or 22 of the optical disc to an optional point DCP and, after a certain time has lapsed, the second user information was recorded from the optional point DCP, that is, the discontinuous recording position, then the phase of a recording clock recorded on the signal track 20 or 22 becomes suddenly changed at the discontinuous recording position $L_t$ as shown at (A) of FIG. 4A. This results from the recording clock recorded on the signal track 20 or 22 of the optical disc being generated on the basis of a reference clock signal included in the support signal in the soft sector system. This recording clock is reproduced by the optical disc reproducing apparatus such that it has a long period during the time interval extending to a predetermined region from the discontinuous recording position DCP, as shown at (B) of FIG. 4B, or such that it has a short period during the time interval extending to a predetermined region from the discontinuous recording position DCP, as shown at (C) of FIG. 4C. As described above, since the recording clock signal recorded in a predetermined region from the discontinuous recording position DCP of the signal track 20 or 22 is reproduced to have a long or short period, the user information recorded in that region is not recorded accurately.

In order to prevent such an error in the user information at the discontinuous recording position of the signal track of the optical disc, there has been suggested an alternative which adds clock stabilization information which is referred to as "variable frequency oscillating signal", hereinafter abbreviated to "VFO signal", to the discontinuous recording position. This clock stabilization information, however, is usually recorded over a single sector region from the discontinuous recording position, thereby causing a waste in the signal track of the optical disc unnecessarily. As a result, the above method of adding the clock stabilization information has a disadvantage in that it reduces the recording capacity of the optical disc considerably as the number of discontinuous recording positions in the signal track of the optical disc increases.

SUMMARY OF THE INVENTION

Accordingly, it is an object of the present invention to provide an optical disc recording method and apparatus which can record a user information at an discontinuous recording position in the signal track of the optical disc in such a manner that the user information is stabbly reproduced and at the same time the recording capacity of the optical disc grows large.

In order to obtain said object of the invention, an optical disc recording method according to one aspect of the present invention comprises the steps of recording a clock stabilization information on a portion of unit blocks adjacent to a discontinuous recording position in a signal track of the optical disc on which a support signal for dividing the signal track into the unit blocks is preformatted in a separate area different from the signal track, and recording a user information on the remaining portion of the unit blocks.

Further, an optical disc recording method according to other aspect of the present invention comprises the steps of detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock, recording a clock stabilization information on a portion of unit blocks adjacent to a discontinuous recording position in the signal track of the optical disc by utilizing the support synchronous signal and the support clock, and recording a user information on the remaining portion of the unit blocks adjacent to the discontinuous recording position by utilizing the support synchronous signal and the support clock.

Furthermore, an optical disc recording method according to another aspect of the present invention comprises the steps of detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, generating a reference clock based on the detected support clock, recording a clock stabilization information on a portion of unit blocks adjacent to a discontinuous recording position in the signal track of the optical disc by utilizing the support synchronous signal and the support clock, and recording a user information on the remaining portion of the unit blocks adjacent to the discontinuous recording position by utilizing the support synchronous signal and the reference clock.

Furthermore, an optical disc recording method according to still another aspect of the present invention comprises the steps of detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, generating a reference clock based on the detected support clock, reproducing a synchronous signal recorded on the signal track, recording a clock stabilization information on a portion of unit blocks adjacent to a discontinuous recording position in the signal track of the optical disc by utilizing the reproduced synchronous signal and the reference clock, and recording a user information on the remaining portion of the unit blocks adjacent to the discontinuous recording position by utilizing the clock stabilization information and the reference clock.

Furthermore, an optical disc recording method according to still another aspect of the present invention comprises the steps of detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, generating a reference clock based on the detected support clock, reproducing a synchronous signal recorded on the signal track, recording a clock stabilization information on a portion of unit blocks adjacent to a discontinuous recording position in the signal track of the optical disc by utilizing the reproduced synchronous signal, the support synchronous signal and the reference clock, the recording a user information on the remaining portion of the unit blocks adjacent to the discontinuous recording position by utilizing the clock stabilization information and the reference clock.

Furthermore, an optical disc recording method according to still another aspect of the present invention comprises the steps of detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, generating a reference clock based on the detected support clock, reproducing a synchronous signal recorded on the signal track, recording a clock stabilization information on a portion of unit blocks adjacent to a discontinuous recording position in the signal track of the optical disc by utilizing the reproduced synchronous signal, the support synchronous signal and the reference clock, generating a pseudo synchronous signal by the clock stabilization information, and recording a user information on the remaining portion of the unit blocks adjacent to the discontinuous recording position by utilizing the pseudo synchronous signal and the reference clock.

Furthermore, an optical disc recording method according to still another aspect of the present invention comprises the steps of detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, generating a reference clock based on the detected support clock, generating a reference synchronous signal based on the detected support synchronous signal, reproducing a synchronous signal recorded on the signal track, recording a clock stabilization information on a portion of unit blocks adjacent to a discontinuous recording position in the signal track of the optical disc by utilizing the reproduced synchronous signal, the support synchronous signal and the reference clock, generating a pseudo synchronous signal by the clock stabilization information, recording a user information on the remaining portion of the unit blocks adjacent to the discontinuous recording position by utilizing the pseudo synchronous signal and the reference clock, and recording the user information on at least one following unit block successive to the unit blocks adjacent to the discontinuous recording position by utilizing the reference synchronous signal and the reference clock.

Furthermore, an optical disc recording apparatus according to still another aspect of the present invention comprises first recording means for recording a clock stabilization information on a portion of unit blocks adjacent to a discontinuous recording position in a signal track of the optical disc on which a support signal for dividing the signal track into the unit blocks is preformatted in a separate area different from the signal track, and second recording means for recording a user information on the remaining portion of the unit blocks.

Furthermore, an optical disc recording apparatus according to still another aspect of the present invention comprises support signal detecting means for detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, first recording means for recording a clock stabilization information on a portion of unit blocks adjacent to a discontinuous recording position in the signal track of the optical disc by utilizing the support synchronous signal and the support clock from the support signal detecting means, and second recording means for recording a user information on the remaining portion of the unit blocks adjacent to the discontinuous recording position by utilizing the support synchronous signal and the support clock from the support signal detecting means.

Furthermore, an optical disc recording apparatus according to still another aspect of the present invention comprises support signal detecting means for detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, reference clock generating means for generating a reference clock based on the support clock from the support signal detecting means, first recording means for recording a clock stabilization information on a portion of unit blocks adjacent to a discontinuous recording position in the signal track of the optical disc by utilizing the support synchronous signal from the support signal detecting means and the reference clock from the reference clock generating means, and second recording means for recording a user information on the remaining portion of the unit blocks adjacent to the discontinuous recording position by utilizing the clock stabilization information from the first recording means and the reference clock from the reference clock generating means.

Furthermore, an optical disc recording apparatus according to still another aspect of the present invention comprises support signal detecting means for detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, reference clock generating means for generating a reference clock based on the detected support clock from the support signal detecting means, reproducing means for reproducing a synchronous signal recorded on the signal track, first recording means for recording a clock stabilization information on a portion of unit blocks adjacent to a discontinuous recording position in the signal track of the optical disc by utilizing the reproduced synchronous signal from the reproducing means and said reference clock from the reference clock generating means, and second recording means for recording a user information on the remaining portion of the unit blocks adjacent to the discontinuous recording position by utilizing the clock stabilization information from the first recording means and the reference clock from the reference clock generating means.

Furthermore, an optical disc recording apparatus according to still another aspect of the present invention comprises support signal detecting means for detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, reference clock generating means for generating a reference clock based on the support clock from the support signal detecting means, reproducing means for reproducing a synchronous signal recorded on the signal track, first recording means for recording a clock stabilization information on a portion of unit blocks adjacent to a discontinuous recording position in the signal track of the optical disc by utilizing the reproduced synchronous signal from the reproducing means, the support synchronous signal from the support signal detecting means and the reference clock from the reference clock generating means, and second recording means for recording a user information on the remaining portion of the unit blocks adjacent to the discontinuous recording position by utilizing the clock stabilization information from the first recording means and the reference clock from the reference clock generating means.

Furthermore, an optical disc recording apparatus according to still another aspect of the present invention comprises support signal detecting means for detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, reference clock generating means for generating a reference clock based on the support clock from the support signal detecting means, reproducing means for reproducing a synchronous signal recorded on the signal track, first recording means for recording a clock stabilization information on a portion of unit blocks adjacent to a discontinuous recording position in the signal track of the optical disc by utilizing the support synchronous signal from the support signal detecting means, the reproduced synchronous signal from the reproducing means and the reference clock from the reference clock generating means, pseudo synchronous signal generating means for generating a pseudo synchronous signal by the clock stabilization information from the first recording means, and second recording means for recording a user information on the remaining portion of the unit blocks adjacent to the discontinuous recording position by utilizing the pseudo synchronous signal from the pseudo synchronous signal generating means and the reference clock from the reference clock generating means.

Furthermore, an optical disc recording apparatus according to still another aspect of the present invention comprises support signal detecting means for detecting a support synchronous signal for dividing a signal track into unit blocks and a support clock for indicating a transfer rate of an information from an optical disc on which a support signal is preformatted in a separate area different from the signal track, the support signal including the support synchronous signal and the support clock, reference clock generating means for generating a reference clock based on the support clock from said support signal detecting means, reference synchronous signal generating means for generating a reference synchronous signal based on the support clock from the support signal detecting means, reproducing means for reproducing a synchronous signal recorded on the signal track, first recording means for recording a clock stabilization information on a portion of unit blocks adjacent to a discontinuous recording position in the signal track of the optical disc by utilizing the support synchronous signal from the support signal detecting means, the reproduced synchronous signal from the reproducing means, and the reference clock from the reference clock generating means, pseudo synchronous signal generating means for generating a pseudo synchronous signal by the clock stabilization information from the first recording means, second recording means for recording a user information on the remaining portion of the unit blocks adjacent to the discontinuous recording position by utilizing the pseudo synchronous signal from the pseudo synchronous signal generating means and the reference clock from the reference clock generating means, and third recording means for recording the user information on at least one following unit block successive to the unit blocks adjacent to the discontinuous recording position by utilizing the reference synchronous signal from the reference synchronous signal generating means and the reference clock from the reference clock generating means.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
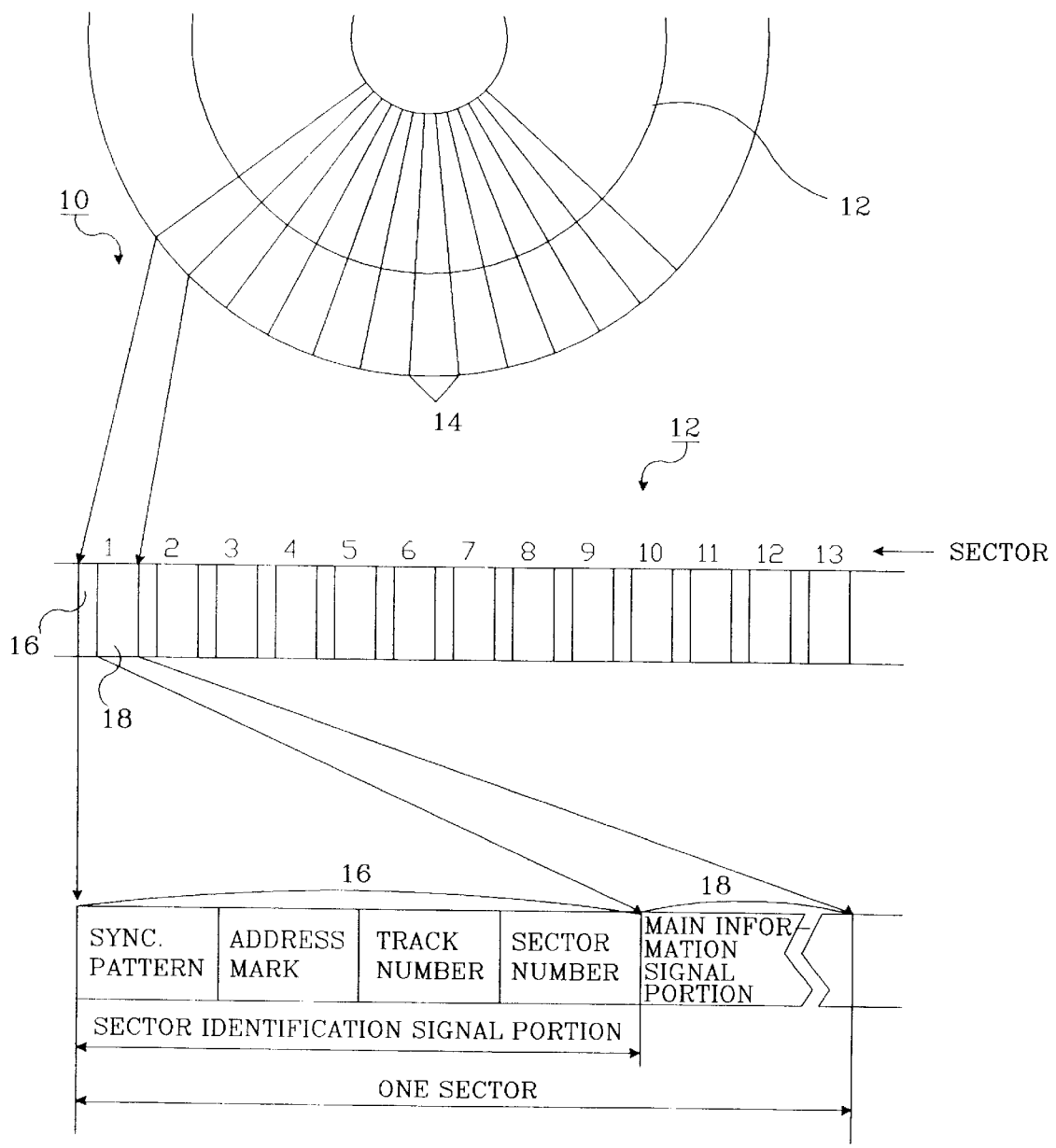
FIG. 1 is a schematic view of an optical disc on which a support signal in the hard sector system is preformatted.
Figure 2:
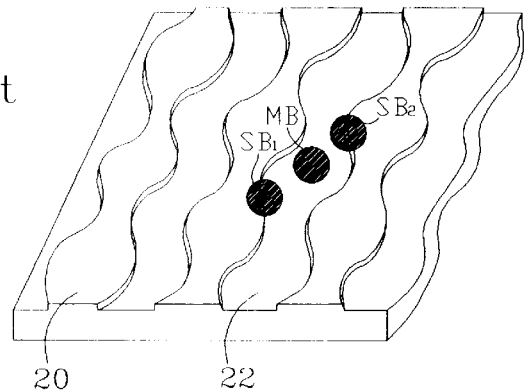
FIG. 2 is a schematic view of an optical disc on which a support signal in the soft sector system is preformatted.
Figure 3:
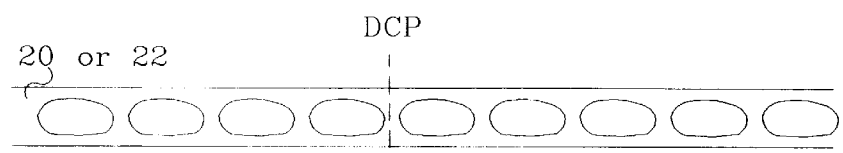
FIG. 3 shows a state in which an information is discontinuously recorded on the signal track of the optical disc shown in FIG. 2.
Figure 4A:
FIGS. 4A, 4B, and 4C show a clock signal recorded on the signal track shown in FIG. 3 along with a reproduced state of the clock signal.
Figure 4B:
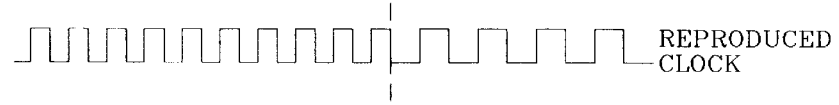
Figure 4C:
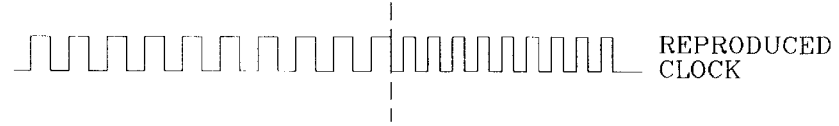
Figure 5:
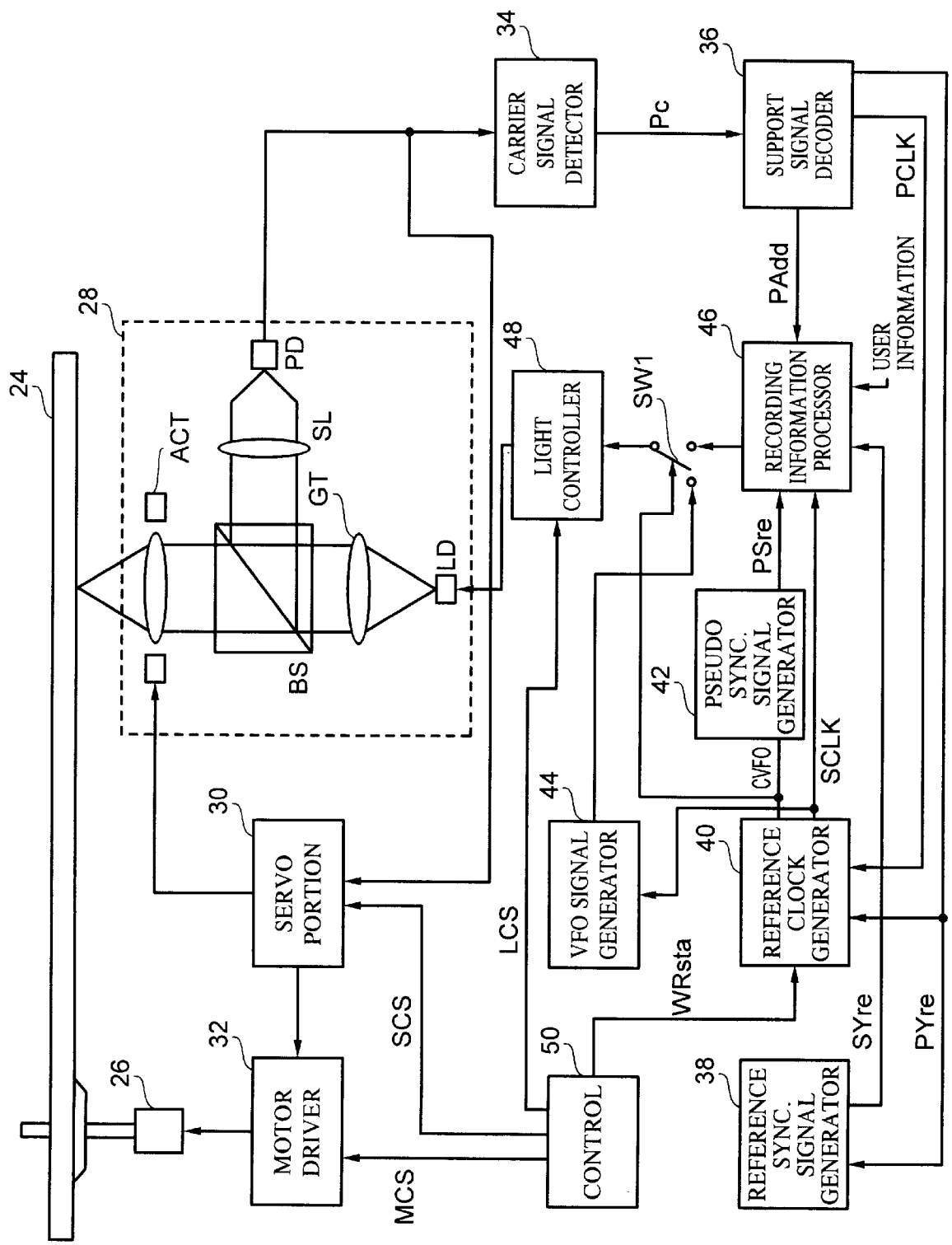
FIG. 5 is a block diagram showing a configuration of an optical disc recording apparatus according to an embodiment of the present invention.

FIG. 5 shows a configuration of an optical disc recording apparatus according to an embodiment of the present invention. Referring to FIG. 5, the optical disc recording apparatus comprises a spindle motor 26 for rotating an optical disc 24, a servo portion 30 connected to an optical pickup 28, and a motor driver 32 connected to the spindle motor 26. The optical pickup 28 irradiates one main light beam MB and two support light beams $SB_1$ and $SB_2$ onto the groove track 22 of the optical disc 24 as shown in FIG. 2, to thereby write an information by the main light beam MB while read a preformatted support signal by the support light beams $SB_1$ and $SB_2$. To this end, the optical pickup 28 comprises a beam splitter BS disposed between a laser diode LD and a light detector PD for distributing a laser light beam, and an objective lens OL arranged between the optical disc 24 and the beam splitter BS. This objective lens OL converges a laser light beam progressing from the beam splitter BS toward the optical disc 24. The beam splitter BS allows a laser light beam generated at the laser diode LD to be irradiated onto the surface of the optical disc 24 via the objective lens OL and, at the same time, allows a light beam reflected by the optical disc 28 to be progressed via a sensor lens SL toward the photo detector PD. The sensor lens SL converges the light beam progressing from the beam splitter BS toward the photo detector PD to thereby control a focus by means of the so-called Astigmatism method. The light beam generated at the laser diode LD is separated into three light beams MB, $SB_1$ and $SB_2$ by means of a diffraction grid GT. Then, the light beams MB, $SB_1$ and $SB_2$ separated by the diffraction grid GT go through the beam splitter BS, and thereafter is converged by the objective lens OL such that they are disposed on the groove track 22 of the optical disc 24 as shown in FIG. 1. On the other hand, the light beams MB, $SB_1$ and $SB_2$ reflected by the groove track 22 of the optical disc 24 go through the objective lens OL and the beam splitter BS in turn, and then converge into the surface of the photo detector PD by the sensor lens SL. Further, the optical detector PD converts the support light beams $SB_1$ and $SB_2$ into electrical signals. The servo portion 30 performs functions of focusing servo, tracking servo, etc., by driving the actuator ACT in the optical pickup 28 by the electrical signals from the photo detector PD. Further, the motor driver 32 controls a rotation speed of the spindle motor 26 in accordance with the signals from the servo portion 30.

Figure 6:
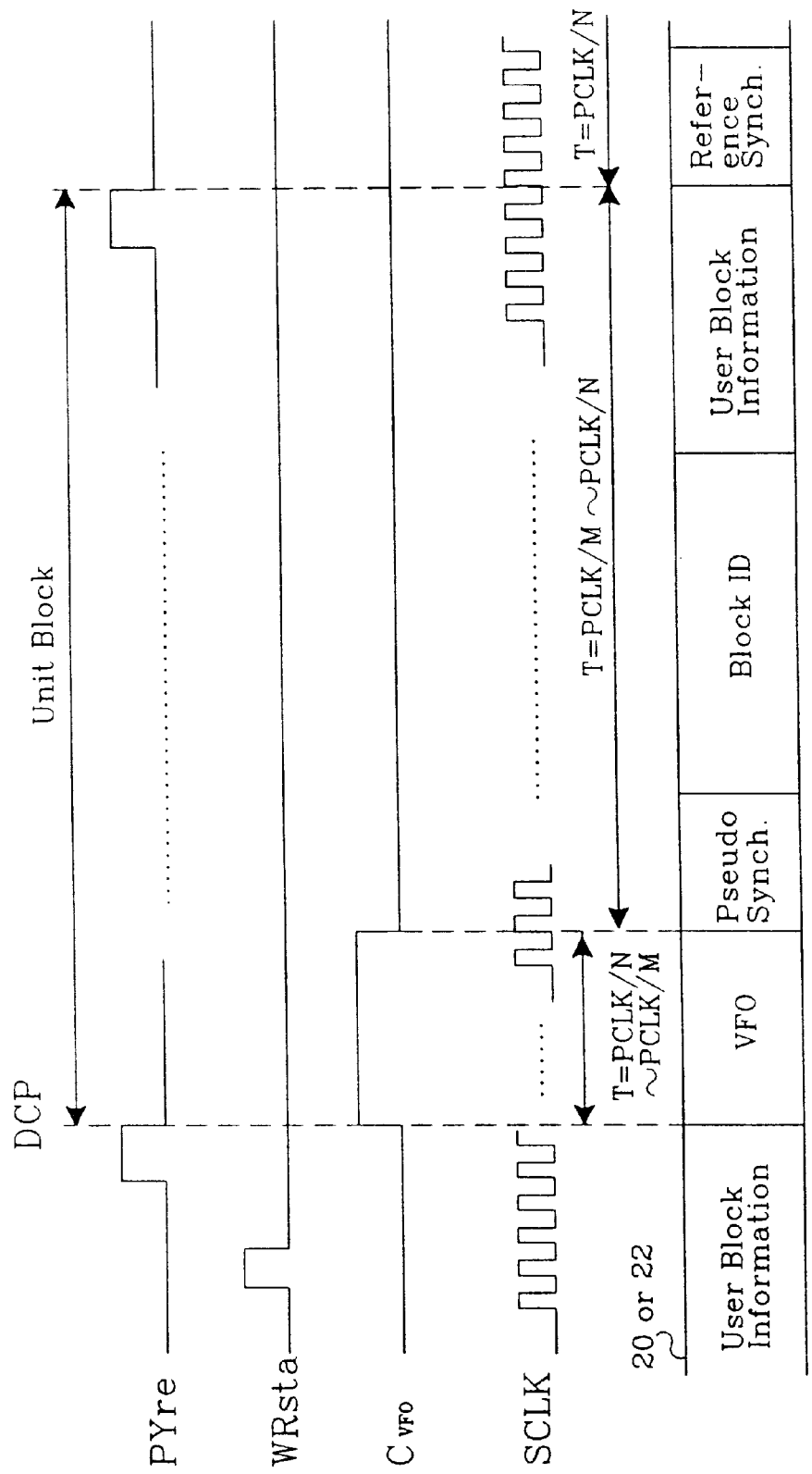
FIG. 6 is output waveform diagrams of each parts in the configuration shown in FIG. 5.

Furthermore, the optical disc recording apparatus includes a carrier signal detector 34 and a support signal decoder 36 which are connected to the photo detector PD in the optical pickup 28 in serial. The carrier signal detector 34 detects a carrier signal Pc from the electrical signals from the optical detector PD. The support signal decoder 36 reconstructs a support address PAdd, a support clock PCLK, and a support synchronous signal PYre, as shown in FIG. 6, from the carrier signal Pc. This support synchronous signal PYre divides the signal track 20 or 22 of the optical disc 24 into a constant size of unit blocks, and the support address PAdd indicates the physical positions with respect to each of the unit blocks.

Furthermore, the optical disc recording apparatus according to the embodiment of the present invention comprises a reference synchronous signal generator 38 for inputting a reference synchronous signal PYre from the support signal decoder 36, a pseudo synchronous signal generator 42 for inputting a stabilization information control signal $C_{VFO}$ from the reference clock generator 40, and a VFO signal generator 44 for generating a VFO signal by utilizing a reference clock SCLK from the reference clock generator 40. The reference synchronous signal generator 38 generates a reference synchronous signal SYre which is synchronized in the phase with the support synchronous signal PYre. The reference clock generator 40 generates a reference clock SCLK, as shown in FIG. 6, which is synchronized in the phase and frequency with a support clock PCLK from the support signal decoder 36. The frequency of this reference clock SCLK rises from N times that of the support clock PCLK to M times that of the support clock PCLK during a certain interval at the time of starting the recording. After the elapse of the certain interval, the frequency of the reference clock SCLK falls from M times that of the support clock PCLK to N times that of the support clock PCLK again. Specifically, the reference clock SCLK has a frequency that changes from N times the frequency of the support clock PCLK into M times the frequency of the support clock PCLK during a time interval corresponding to a range from the discontinuous recording position DCP to a position of the signal track 20 or 22 of the optical disc 24 in which the recording of the VFO signal is completed. After the recording of the VFO signal, the reference clock SCLK has a frequency reduced gradually from M times the frequency of the support clock PCLK to N times the frequency of the support clock PCLK during the time interval corresponding to a range from an end position of the region recorded by the VFO signal to an end position of the unit block adjacent to the discontinuous recording position DCP or during the time interval corresponding to a certain number of unit blocks. Further, the reference clock generator 40 generates a stabilization information control signal $C_{VFO}$ by utilizing both a recording start signal $WR_{sta}$, as shown in FIG. 6, from the controller 48 and the support synchronous signal PYre. This stabilization information control signal $C_{VFO}$ allows the VFO signal to be inserted to the discontinuous recording position DCP on the signal track 20 or 22 of the optical disc 24 in which the phase of the clock signal recorded on the signal track 20 or 22 of the optical disc 24 changes suddenly. The stabilization information control signal $C_{VFO}$ has a very short width of pulse compared with the unit block on the signal track 20 or 22 of the optical disc 24, as shown in FIG. 6, such that the VFO signal can be recorded in a partial region of the unit block adjacent to the discontinuous recording position. Moreover, the reference clock generator 40 can generate a locking signal LK which has a specific logic, for example, a high logic when the reference clock SCLK has a frequency corresponding to a certain scope of multiple number, that is, a range from N times to M times in comparison to the frequency of the support clock PCLK. The pseudo synchronous signal generator 42 generates a pseudo synchronous signal PSre which maintains a specific logic, for example, a high logic during a certain time interval from the end point, for example, the falling edge of the stabilization information control signal $C_{VFO}$. This pseudo synchronous signal PSre is a pulse of specific logic the width of which is narrower than that of the reference synchronous signal. To this end, the pseudo synchronous signal generator 42 may comprises a monostable multivibrator.

Furthermore, the optical disc recording apparatus includes a recording information processor 46 for inputting user information, and a control switch SW1 for selectively applying a VCO signal from the VCO signal generator 44 and a recording signal from the recording information processor 46 to the light controller 48. The recording information processor 46 divides a user information into a constant size to produce user block information portions, and add the head of these user block information portions to the support address PAdd from the support signal decoder 36 and the pseudo synchronous signal PSre from the pseudo synchronous signal generator 42, thereby forming user information blocks. The recording information processor 46 supplies the user information blocks to the control switch SW1 as a recording signal in conformity with the reference clock SCLK from the reference clock generator 40. The user information block including the pseudo synchronous signal is transferred by the reference clock SCLK, the frequency of which is M times the frequency of the support clock PCLK, thereby allowing it to be recorded on a single of unit block in the signal track 20 or 22 of the optical disc 24 along with the VFO signal. In other words, the user information block including the pseudo synchronous signal PSre is compressed with the lapse of time to have a shorter time period compared with the user information block including the reference synchronous signal SYre. The control switch SW1 selectively transfers the VFO signal and the recording signal into the light controller 48 in accordance with a logical state of stabilization information control signal $C_{VFO}$ from the reference clock generator 40. Specifically, if the stabilization information control signal $C_{VFO}$ remains at a specific logic, i.e., a high logic, then the control switch SW1 applies the VFO signal from the VFO signal generator 44 to the light controller 48. On the other hand, if the stabilization information control signal $C_{VFO}$ remains at a grounding logic, i.e., a low logic, then it transfers the recording signal from the recording information processor 46 into the light controller 48. The light controller 48 intermits the laser diode LD in accordance with a logical value of the output signal of the control switch SW1, thereby allowing the user information blocks to be recorded on the signal track, that is, the land track 20 or the groove track of the optical disc 24. At this time, as shown in FIG. 6, the pseudo synchronous signal PSre, the block identification code and the user block information including the VFO signal as a clock stabilization information are sequentially recorded on the unit block adjacent to the discontinuous recording position DCP of the signal track 20 or 22, that is, on the optional unit block in the signal track 20 or 22 on which a head of the user information is to be recorded at the time of starting the recording. On the other hand, the reference synchronous signal SYre, the block identification code and the user block information are recorded in each of the block regions positioned away from the discontinuous recording position DCP.

Finally, the control 50 controls the operation of the servo portion 30 and the motor driver 32 as well as the operation mode of the light controller 42. The control 50 generates a recording start signal $WR_{sta}$ which has a pulse of specific logic, i.e., a high logic at the time of starting the recording. This recording start signal $WR_{sta}$ is applied to the reference clock generator 40 to record the VFO signal as a clock stabilization signal in a certain region extending from the discontinuous recording position in the signal track 20 or 22 of the optical disc 24. Further, the control 50 can input a locking signal LK from the reference clock generator 40. The control 50 enables the recording operation of the light controller 48 selectively in accordance with a logical state of the locking signal LK. Specifically, the control 50 allows the light controller 48 to carrying out the recording operation only when the locking signal LK remains at a specific logic, i.e., a high logic, thereby maintaining a recording capacity of the optical disc 24 constantly as well as preventing an occurrence of error.

Figure 7:
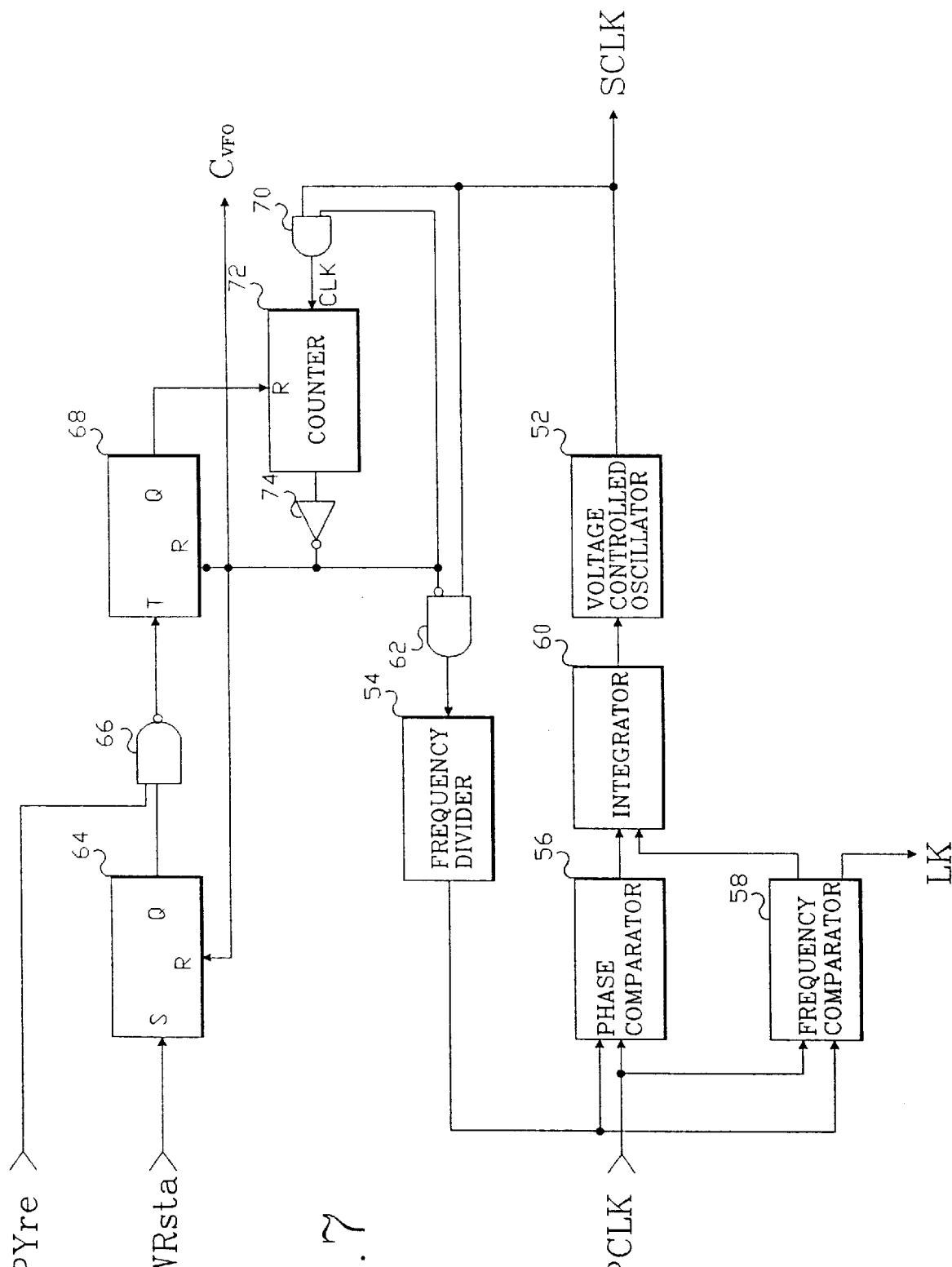
FIG. 7 is a detailed circuit diagram of the reference clock generator shown in FIG. 5.

FIG. 7 is a block diagram illustrating in detail the reference clock generator 40 shown in FIG. 5. In FIG. 7, the reference clock generator 40 comprises a frequency divider 54 for inputting a reference clock SCLK from a voltage controlled oscillator 52 via the first AND gate 62, and a phase comparator 56 and a frequency comparator 58 which input an output signal of the frequency divider 54 commonly. The first AND gate 62 switches a reference clock SCLK to be applied to the variable frequency divider 54 from the voltage controlled oscillator 52 in accordance with the stabilization information control signal $C_{VFO}$. Specifically, the first AND gate 62 allows a reference clock SCLK from the voltage controlled oscillator 52 to be supplied to the frequency divider 54 when the stabilization information control signal $C_{VFO}$ remains at a high logic. In other words, the first AND gate 62 supplies the frequency divider 54 with a logic signal of low logic. Accordingly, a logical signal of low or high logic is generated also at the frequency divider 52. At this time, the phase comparator 56 compares the phase of the support clock PCLK from the support signal decoder 36 shown in FIG. 5 with that of the logical signal from the frequency divider 54 to apply a phase error signal with a voltage signal increasing suddenly to an integrator 60. Also, the frequency comparator 58 comparing the frequency of the support clock PCLK with the logical signal from the frequency divider 54 applies a frequency error signal having a voltage increasing suddenly to the integrator 60. The integrator 60 integrates the phase error signal from the phase comparator 56 and the phase error signal from the frequency comparator 58, respectively, and eliminates noise signals of high frequency component included in these signals. The voltage controlled oscillator 52 raises the frequency of the reference clock SCLK suddenly from N times the frequency of the support clock PCLK to M times the frequency of the support clock PCLK in accordance with the phase error signal and the frequency error signal integrated from the integrator 60. As a result, the frequency of the reference clock SCLK rises suddenly from N times the frequency of the support clock PCLK to M times the frequency thereof at the rising edge of stabilization information control signal $C_{VFO}$, and then maintains M times the frequency of the support clock PCLK until the falling edge of the stabilization information control signal $C_{VFO}$. Otherwise, if the stabilization information control signal $C_{VFO}$ remains at a low logic, then the first AND gate 62 allows the reference clock SCLK from the voltage controlled oscillator 52 to be applied to the frequency divider 54. In this case, the frequency divider 54 makes an N frequency division of the reference clock SCLK from the first AND gate 62. At this time, the phase comparator 56 generates a phase error signal having a voltage signal decreasing gradually in accordance with a phase difference between the frequency-divided clock signal from the frequency divider 54 and the support clock PCLK. Likewise, the frequency comparator 58 generates a frequency error signal having a voltage decreasing gradually in accordance with a frequency difference between the clock signal from the frequency divider 54 and the support clock PCLK. Subsequently, the voltage controlled oscillator 52 inputting both the phase error signal and the frequency error signal via the integrator 60 reduces the frequency of the reference clock SCLK gradually from M times the frequency of the support clock PCLK to N times the frequency thereof. Accordingly, the frequency of the reference clock SCLK becomes to be reduced gradually from M times the frequency of the support clock to N times the frequency thereof during a certain time interval from the falling edge of stabilization information control signal $C_{VFO}$, for example, during a time interval corresponding to a range from the end position of the region in the signal track 20 or 22 on which the stabilization information control signal $C_{VFO}$ is recorded to the end position of the unit block on which stabilization information control signal $C_{VFO}$. Also, this reference clock SCLK is applied to the VFO signal generator 44 and the recording information processor 46 as shown in FIG. 5. Further, the frequency comparator 58 can generate a locking signal LK having a specific logic, i.e., a high logic in the case where the frequency of the frequency-divided clock signal has a certain difference from that of the support clock PCLK, that is, where the frequency of the reference clcok SCLK has N times to M times the frequency of the support clock PCLK. This locking signal LK is supplied to the control 50 shown in FIG. 5.

Further, the reference clock generator 40 includes the first latch 64 inputting a recording start signal $WR_{sta}$, and a NAND gate 66 inputting a support synchronous signal PYre from the support signal decoder 36 shown in FIG. 5. The first latch 64 generates an output signal of high logic at an output terminal Q when the recording start signal $WR_{sta}$ with a high logic is inputted to a set terminal S thereof. The NAND gate 66 provides a NAND operation of the output signal of the first latch 64 and the support synchronous signal PYre and selectively the second latch 68 in accordance with the operated resultant value. Specifically, the NAND gate 66 generates a high logic of pulse only when either of the output signal of the first latch 64 and the support synchronous signal PYre remain at a high logic. The second latch 68 changes a logical signal at an output terminal Q thereof from a low logic to a high logic at the rising edge of the low logic pulse from the NAND gate 66. The first and second latches 64 and 68 are initialized by the stabilization information control signal $C_{VFO}$ with a grounding logic, i.e., a low logic applied to reset terminals R of them.

Furthermore, the reference clock generator 40 includes the second AND gate 70 inputting the reference clock SCLK from the voltage controlled oscillator 52, a counter 72 inputting an output signal of the second latch 68, and an inverter 74 inputting a carry signal from the counter 72. The second AND gate 70 delivers the reference clock SCLK from the voltage controlled oscillator 52 into a clock terminal CLK of the counter 72 only when the stabilization information control signal $C_{VFO}$ remains at a specific logic, i.e., a high logic. The counter 72 increments by the reference clock SCLK supplied from the second NAND gate 70 during the time when a high logic signal is applied from the second latch 68 to the reset terminal R thereof. The counter 72 generates a high logic of carry signal when the counted value arrives at "K". Further, the counter 72 becomes to stop the counting operation by a low logic signal applied from the second latch 68 to the reset terminal R thereof after generating the carry signal. The inverter 74 inverts a carry signal from the counter 72 and applies the inverted carry signal to the first and second AND gates 62 and 70, the first and second latch 64 and 68, and the control switch SW1 and the pseudo synchronous signal generator 42 as shown in FIG. 5 as the stabilization information control signal $C_{VFO}$. As a result, the second latch 68, the second AND gate 70, the counter 72 and the inverter 74 functions as a monostable pulse generator generating the stabilization information control signal $C_{VFO}$ which has a high logic pulse with a constant width from the falling edge of the first support synchronous signal PYre at the time of starting the recording.

Figure 8:
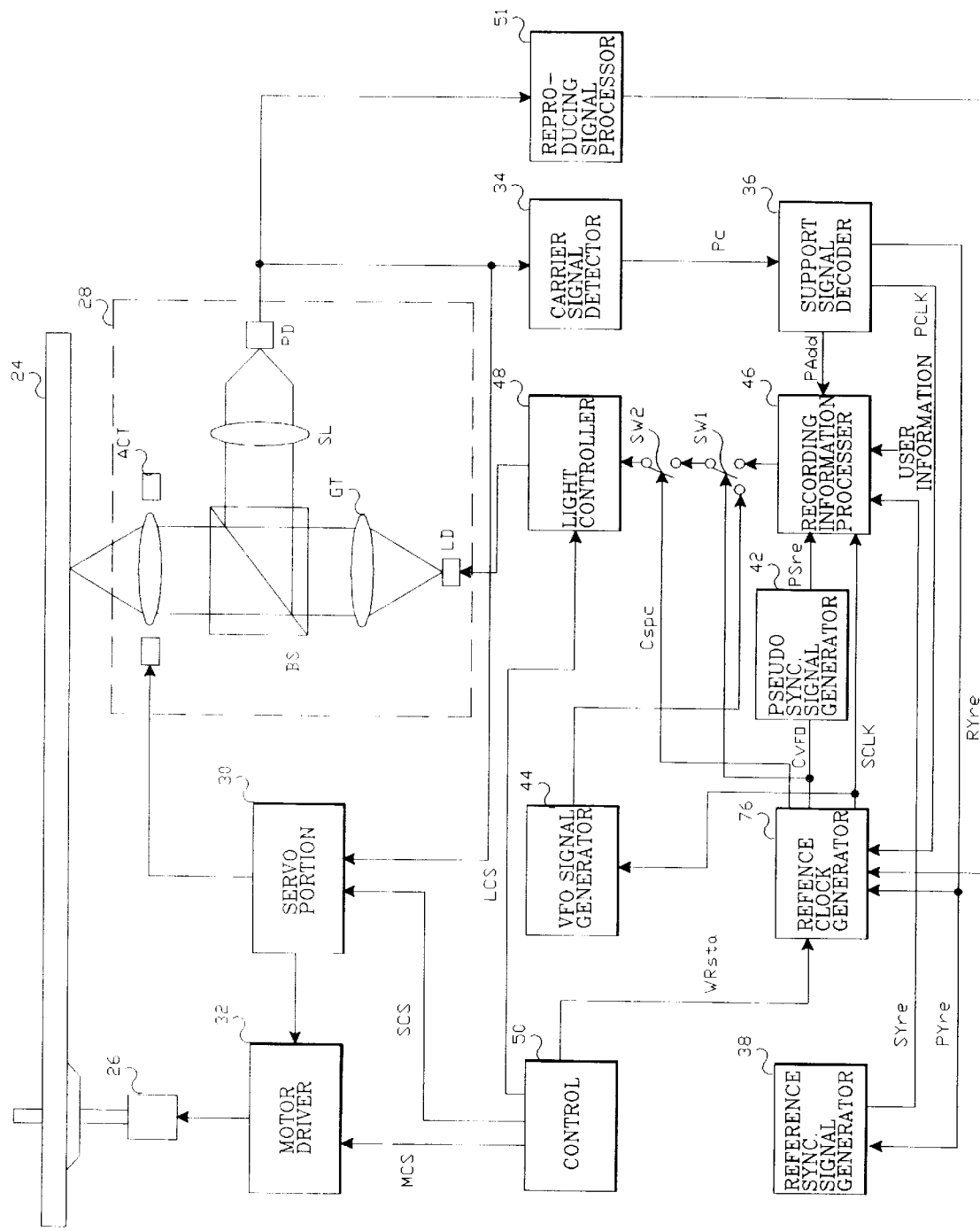
FIG. 8 is a block diagram showing a configuration of an optical disc recording apparatus according to another embodiment of the present invention.

FIG. 8 is a block diagram of an optical disc recording apparatus according to other embodiment of the present invention. This optical disc recording apparatus in FIG. 8 further comprises the second control switch SW2 connected between the control switch SW1 and the light controller 48 when compared with the optical disc recording apparatus shown in FIG. 5. Further, in the optical disc recording apparatus according to other embodiment of the present invention, the reference clock generator 48 is replaced by an adaptive reference clock generator 76.

Figure 9:
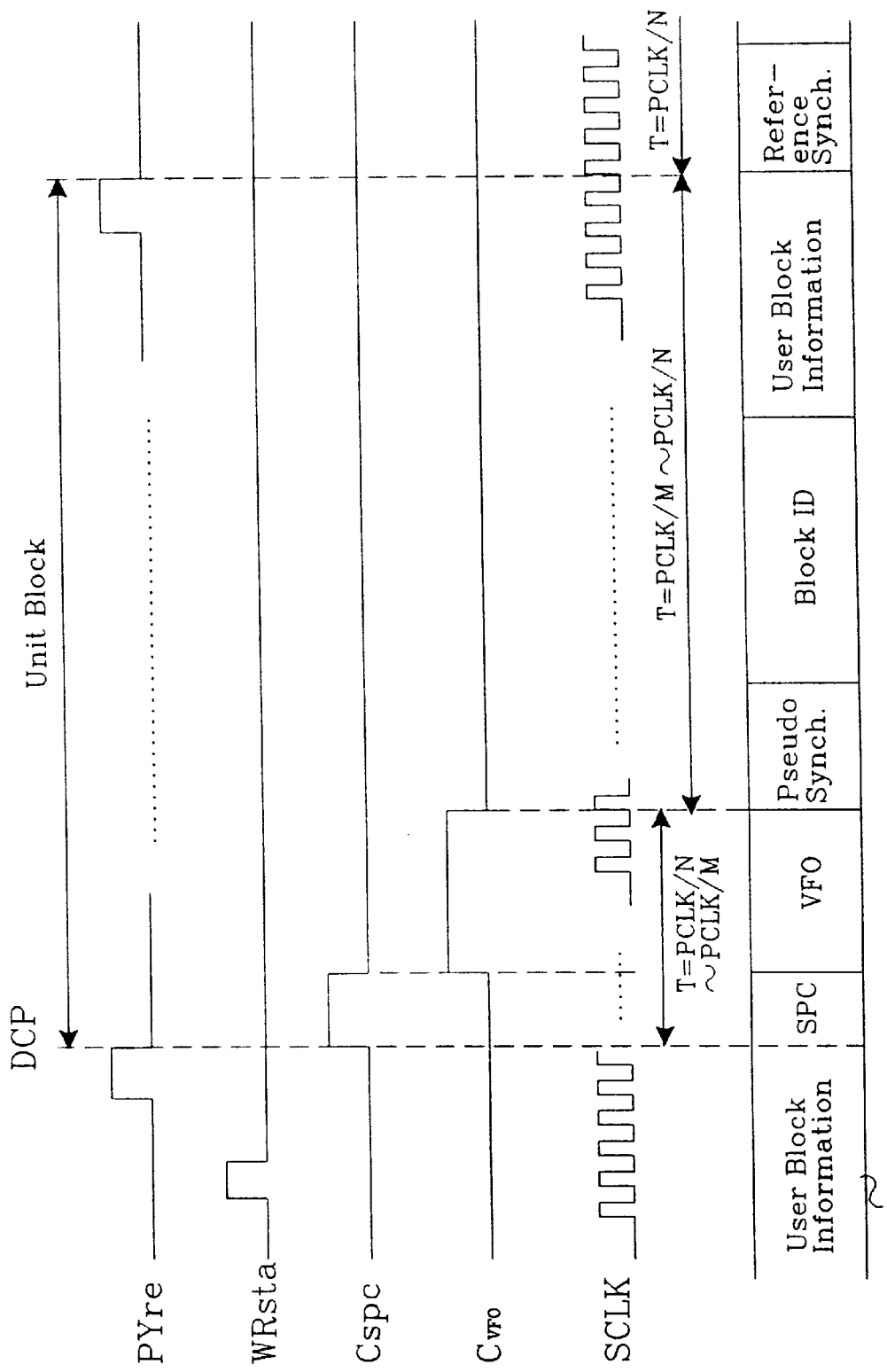
FIG. 9 to FIG. 12 are output waveform diagrams of each parts in the configuration shown in FIG. 8, respectively.

This adaptive reference clock generator 76 generates a reference clock SCLK shown in FIG. 9 in similar to the reference clock generator 40 shown in FIG. 5 and applies the reference clock SCLK to the recording information processor 46 and the VFO signal generator 44. As shown in FIG. 9, the adaptive reference clock generator 76 generates a space control signal $C_{SPC}$ and a stabilization information control signal $C_{VFO}$ which are sequentially arranged from the falling edge of the first support synchronous signal PYre after a recording start signal $WR_{sta}$ is generated. By this space control signal $C_{SPC}$, the second control switch SW2 selectively connects the recording information processor 46 to the light controller 48, thereby to produce a space region in the signal track 20 or 22 of the optical disc 24 on which an information is not recorded. This space region is disposed between the discontinuous recording position DCP in the signal track 20 or 22 of the optical disc 24. In other words, as shown in FIG. 9, a space region SPC, a VFO signal VFO, a pseudo synchronous signal PSre, a block identification signal and a user block information are recorded in the block region adjacent to the discontinuous recording position DCP in the signal track 20 or 22 of the optical disc 24.

Figure 10:
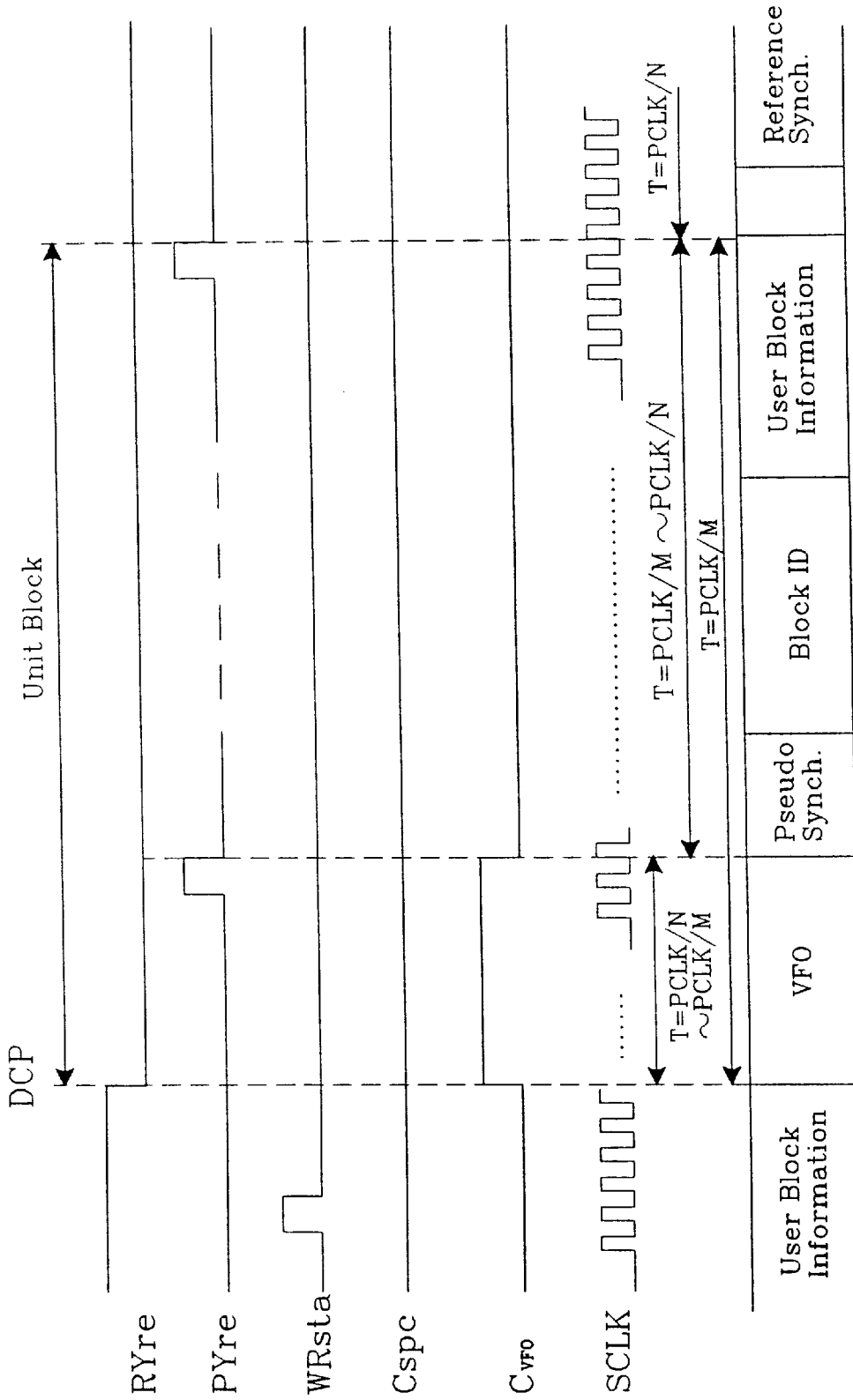
Figure 11:
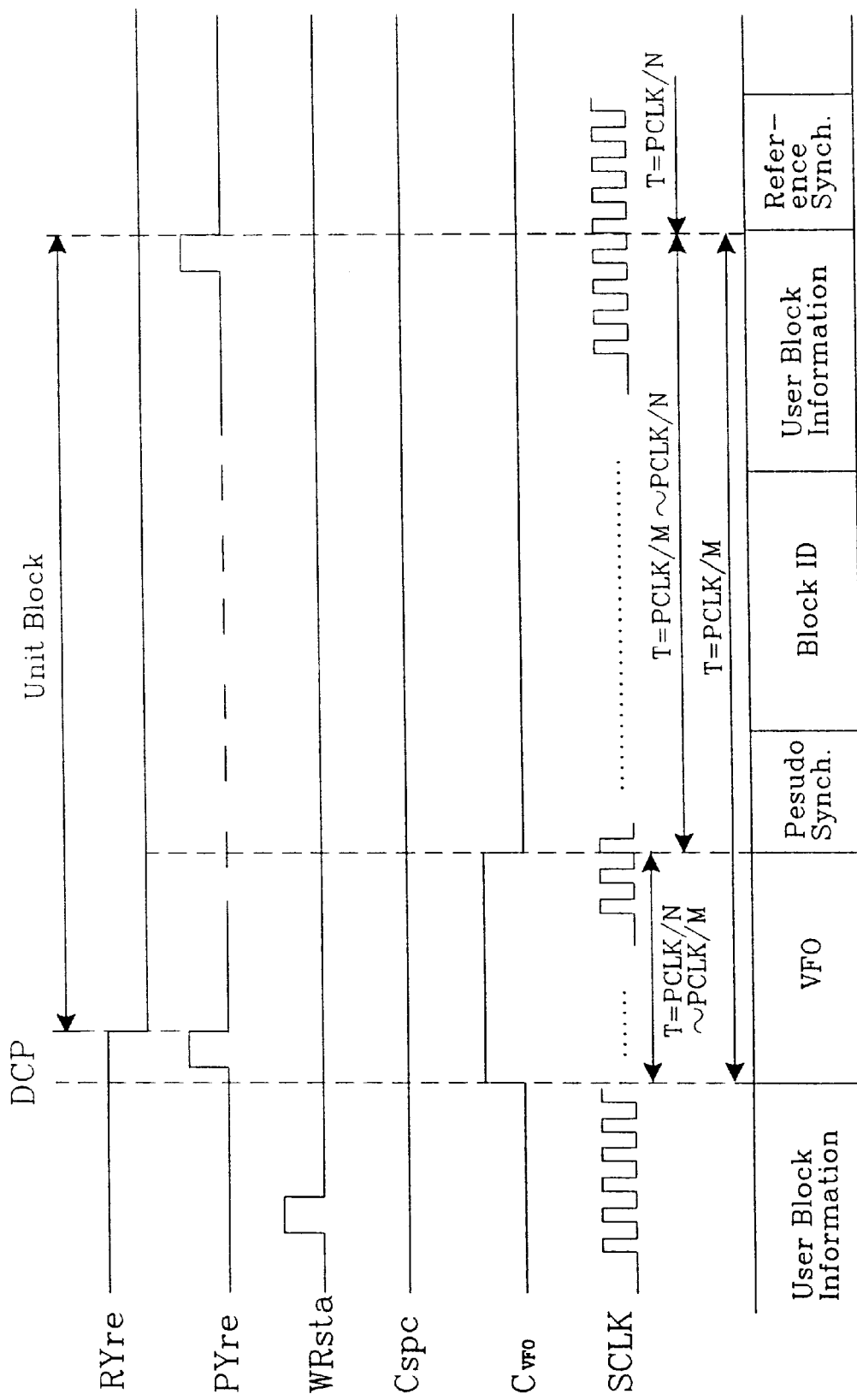
Figure 13:
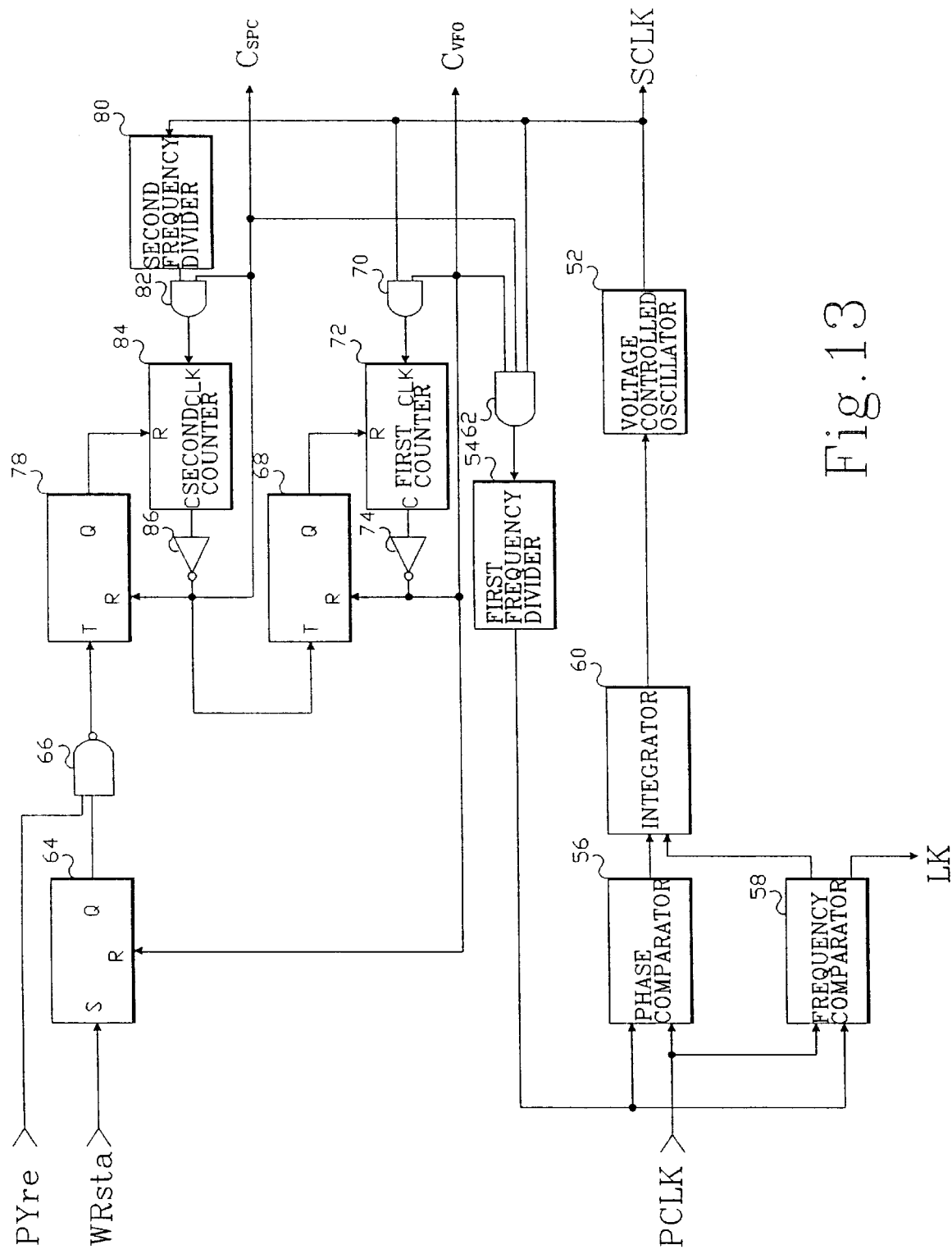
FIG. 13 is a detailed circuit diagram of the first embodiment of the adaptive reference clock generator shown in FIG. 8.

Further, the optical disc recording apparatus according to other embodiment of the present invention may includes a reproducing signal processor 51 which reproduces an output signal of the photo detector PD in the optical pickup 28 and supplies the reproducing synchronous signal RYre to the adaptive reference clock generator 76. In this case, the adaptive reference clock generator 76 changes a logical state of the space control signal $C_{SPC}$ in accordance with an order relationship in the phase of the reproducing synchronous signal RYre with the support synchronous signal PYre. Specifically, the adaptive reference clock generator 76 allows the space control signal $C_{SPC}$ to maintain only a grounding logic, i.e., a low logic, as shown in FIGS. 10 and 11, in the case where the phase of the reproducing synchronous signal SYre advances that of the support synchronous signal PYre the adaptive reference clock generator 76, thereby allowing the space region not to appear on the signal track 20 or 22 of the optical disc 24. In other words, on the unit block adjacent to the discontinuous recording position DCP in the signal track 20 or 22 of the optical disc 24, there are recorded the VFO signal VFO, the pseudo synchronous signal PSre, the block identification signal and the user block information. On the other hand, if the phase of the reproducing synchronous signal RYre retards that of the support synchronous signal PYre as shown in FIG. 13, then the adaptive reference clock generator 76 allows the space control signal $C_{SPC}$ to maintain a high logic from the falling edge of the support synchronous signal PYre until the rising edge of the reproducing synchronous signal RYre, thereby producing the space region in the signal track 20 or 22 of the optical disc 24. In other words, as shown in FIG. 9, the space region SPC, the VFO signal VFO, the pseudo synchronous signal PSre, the block identification signal and the user block information are recorded on the unit block adjacent to the discontinuous recording position DCP in the signal track 20 or 22 of the optical disc 24.

FIG. 13 is a detailed circuit diagram of the first embodiment of the adaptive clock generator 76 shown in FIG. 8. Referring to FIG. 13, when compared with the reference clock generator 40 as shown in FIG. 7, the adaptive reference clock generator 76 further comprises the third latch 78, the second counter 84 and the second inverter which are connected between the NAND gate 66 and the second latch 68 in serial, and the second frequency divider 80 and the third AND gate 82 which are connected between the voltage controlled oscillator 52 and a clock terminal CLK of the second counter 84. Also, the adaptive reference clock generator 76 includes the fourth AND gate 88 for inputting the reference clock SCLK from the voltage controlled oscillator 52, the stabilization information control signal $C_{VFO}$ from the first inverter 74 and space control signal $C_{SPC}$ from the second inverter 86 in place of the first AND gate 62 shown in FIG. 7.

The third latch 78 changes a logical signal at the output terminal Q thereof from a low logic into a high logic at the falling edge of an output signal of the NAND gate 66. In other words, as shown in FIG. 9, the third latch 78 generates a high logic of output signal at the falling edge of the support synchronous signal PYre inputted in the first order after the recording start signal $WR_{sta}$ is generated. The second frequency divider 80 makes an N frequency-division of the reference clock SCLK from the voltage controlled oscillator 52 and supplies the frequency-divided reference clock to the third AND gate 82. The third AND gate 82 delivers the frequency-divided reference clock from the first frequency divider 80 into the clock terminal CLK of the second counter 84 only when the space control signal $C_{SPC}$ as shown in FIG. 9 remains at a specific logic, i.e., a high logic. The second counter 84 increments by the frequency-divided reference clock from the third AND gate 82 during the time when a high logic signal is applied from the third latch 78 to the reset terminal R thereof. The second counter 84 generates a high logic of carry signal when the counted value arrives at "L". Further, the counter 72 becomes to stop the counting operation by a low logic signal applied from the third latch 78 to the reset terminal R thereof after generating the carry signal. The second inverter 86 inverts a carry signal from the second counter 84 and applies the inverted carry signal to the third and fourth AND gates 82 and 88, the third latch 78 and the second control switch SW2 as the space control signal $C_{SPC}$. As a result, the third latch 78, the third AND gate 82, the second counter 84 and the second inverter 86 functions as a monostable pulse generator generating the space control signal $C_{SPC}$ which has a high logic pulse with a constant width from the falling edge of the first support synchronous signal PYre at the time of starting the recording. By this the space control signal $C_{SPC}$, the second latch 68 determines a generation time of the stabilization information control signal $C_{VFO}$. In other words, the second latch 68 initiates the counting operation of the first counter 72 at the falling edge of the space control signal $C_{SPC}$ from the second inverter 86 and thereafter it is initialized by the stabilization information control signal $C_{VFO}$ with a low logic from the first inverter 74, thereby allowing the stabilization information control signal $C_{VFO}$ to have a high logic with a constant width from the falling edge of the space control signal $C_{SPC}$, as shown in FIG. 9.

In the mean time, the fourth AND gate 88 switches the reference clock SCLK to be applied to the first frequency divider 54 from the voltage controlled oscillator 52 in accordance with the stabilization information control signal $C_{VFO}$ and the space control signal $C_{SPC}$. Specifically, if any one of the stabilization information control signal $C_{VFO}$ and the space control signal $C_{SPC}$ remains at a high logic, then the fourth AND gate 88 allows the reference clock SCLK from the voltage controlled oscillator 52 not to be supplied for the first frequency divider 54. In other words, the fourth AND gate 88 allows the reference clock SCLK not to be applied to the first frequency divider 54 in the time interval when the space signal and the VFO signal are recorded on the signal track 20 or 22 of the optical disc 24. Otherwise, if all of the stabilization information control signal $C_{VFO}$ and the space control signal $C_{SPC}$ remain at a low logic, then the fourth AND gate 88 allows the reference clock SCLK from the voltage controlled oscillator 52 to be supplied for the first frequency divider 54.

Since the configuration and operation of the above adaptive reference clock generator 76 is identical to those of the reference clock generator 40 as shown in FIG. 5 except for the second and third latches 68 and 78, the third and fourth AND gates 82 and 88, the frequency divider 80, the second counter 86, and the second inverter 86, an explanation as to them is omitted herein.

Figure 14:
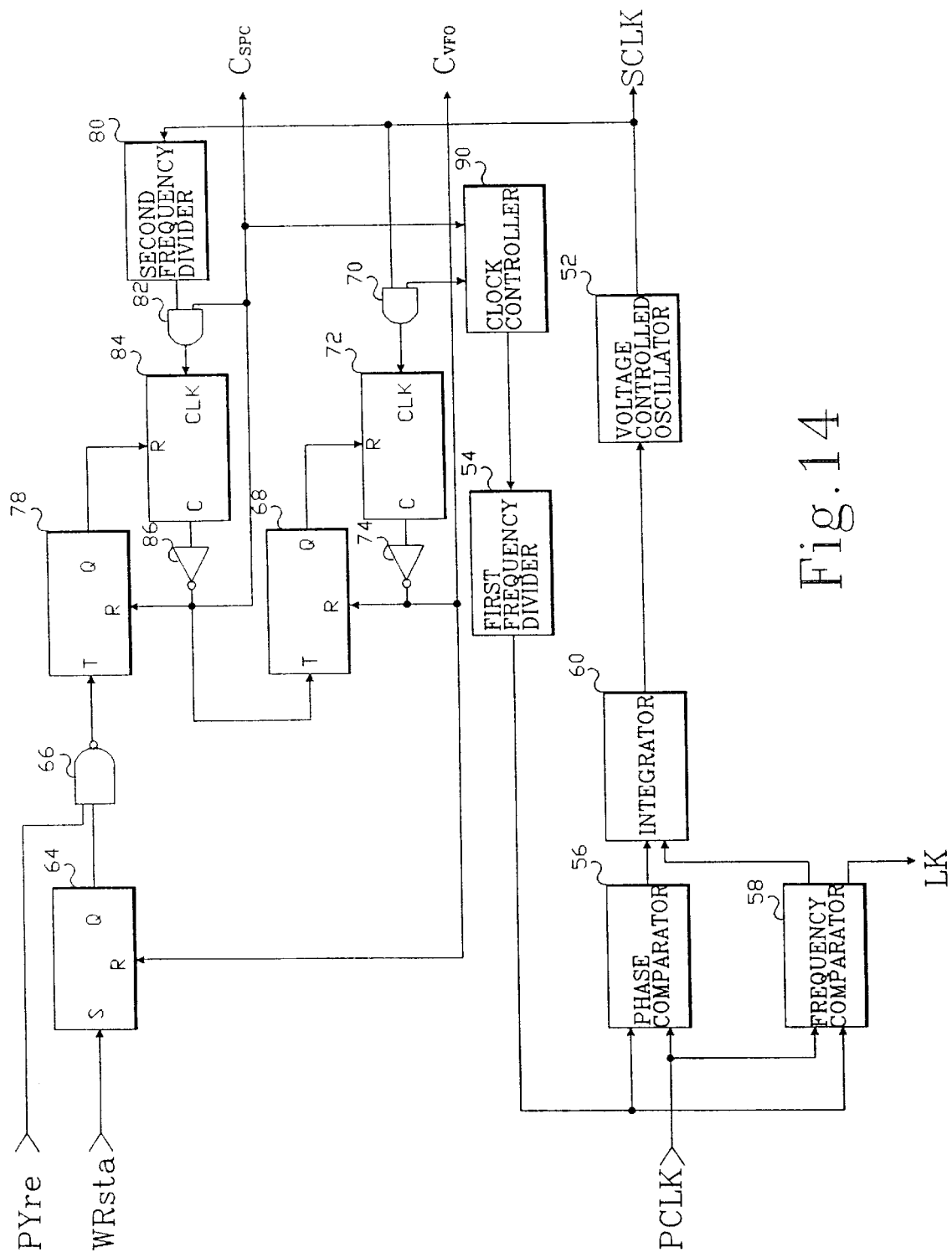
FIG. 14 is a detailed circuit diagram of the second embodiment of the adaptive reference clock generator shown in FIG. 8.

FIG. 14 is a detailed circuit diagram of the second embodiment of the adaptive reference clock generator 76 shown in FIG. 8. The adaptive reference clock generator 76 shown in FIG. 14 has the same circuit configuration as the adaptive reference clock generator 76, except that the fourth AND gate 88 is replaced by the clock controller 90. This clock controller 90 allows the frequency of the reference clock SCLK to maintain M times the frequency of the support clock PCLK constantly during a certain time interval from the time point at which the space control signal $C_{SPC}$ is enabled, for example, during a time interval corresponding to a range from the discontinuous recording position DCP to the end position of a single unit block. To this end, the clock controller 90 eleminates the reference clock SCLK transferred from the voltage controlled oscillator 52 one by one every constant time period during a time interval corresponding to a single unit block, after the space control signal $C_{SPC}$ from the second inverter 86 was changed from a low logic to a high logic. In this case, a phase error signal generated at the phase comparator 56 and a frequency error signal generated at the frequency comparator 58 increase and decrease alternately every constant period, respectively. Accordingly, the voltage controlled oscillator 52 responsive to the phase error signal and the frequency error signal allows the phase of the reference clock SCLK to become identical to that of the support clock PCLK and at the same time allows the frequency of the reference clock SCLK to maintain M times the frequency of the support clock PCLK constantly, by controlling the phase and frequency of the reference clock SCLK. Otherwise, if either of the stabilization information control signal $C_{VFO}$ and the space control signal $C_{SPC}$ remain at a grounding logic, i.e., a low logic, then the clock controller 90 allows the frequency of the reference clock SCLK to maintain N times the frequency of the support clock PCLK constantly, by delivering the reference clock SCLK from the voltage controlled oscillator 52 into the first frequency divider 54 as it is.

Figure 15:
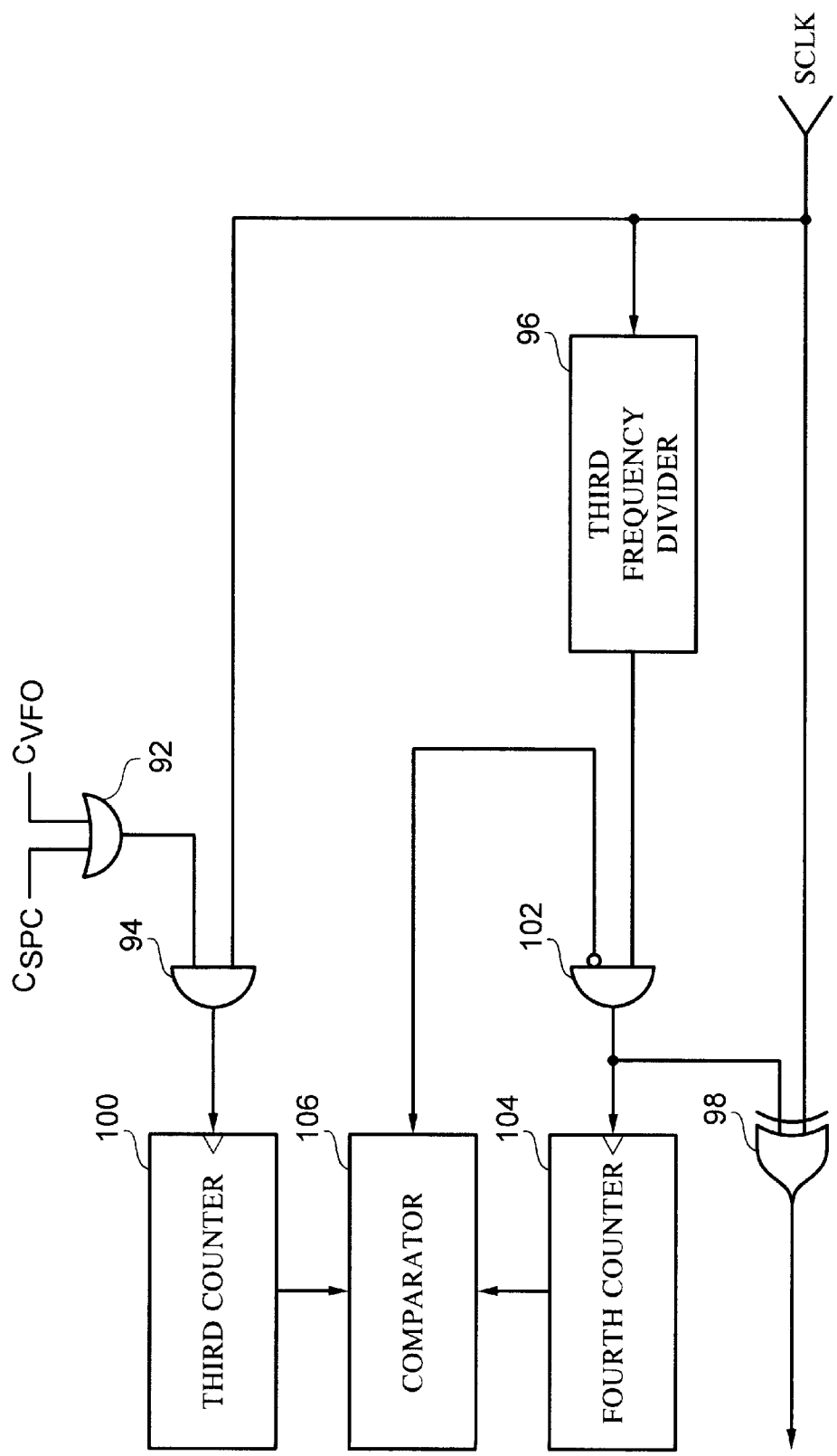
FIG. 15 is a detailed circuit diagram of the variable phase delay circuit shown in FIG. 14.

FIG. 15 is a detailed circuit diagram of the variable phase delay circuit shown in FIG. 14. Referring to FIG. 15, the variable phase delay circuit 90 comprises an OR gate 92 for inputting the stabilization information control signal $C_{VFO}$ and the space control signal $C_{SPC}$ from the first and second inverters 74 and 86 shown in FIG. 14, and the fifth AND gate 94, the second frequency divider 96 and the exclusive OR, hereinafter referred simply to as "XOR", gate 98 which commonly input the reference clock SCLK from the voltage controlled oscillator 52 shown in FIG. 14. The OR gate 92 makes an OR operation of the stabilization information control signal $C_{VFO}$ and the space control signal $C_{SPC}$ to thereby generate a pulse signal maintaining a high logic during the time interval corresponding to the sum of high logic intervals of these two signals. The fifth AND gate 94 delivers the reference clock SCLK into the clock terminal CLK of the third counter 100 during the time interval when an output signal of the OR gate 92 remains at a high logic. The third counter 100 counts the number of the clock signal applied from the fifth AND gate 94 to the clock terminal CLK thereof. Further, the third frequency divider 96 frequency-divides the reference clock SCLK by a certain of frequency-division ratio, for example, by 4, and supplies the frequency-divided reference clock via the sixth AND gate 102 to the fourth counter 104. The fourth counter 104 counts the number of the frequency-divided reference clock from the sixth AND gate 102. The count value of the third counter 100 and that of the fourth counter 104 are compared by a comparator 106. This comparator 106 supplies a high logic of comparison signal to the sixth AND gate 102 in the case where the two counted values are equal to each other, thereby allowing the frequency-divided reference clock outputted from the third frequency divider 96 not to be applied to the fourth counter 104 and the XOR gate 98. In other words, the sixth AND gate 102 becomes to supply the frequency-divided reference clock to the XOR gate 98 only during the time interval extending from the time point of starting the recording to the time point when the count value of the fourth counter 104 becomes equal to that of the third counter 100. The XOR gate 98 disappears one cycle of reference clock from the reference clock SCLK to be applied to the first frequency divider 54 shown in FIG. 14 by inverting the phase of the reference clock SCLK by 180° whenever the frequency-divided reference clock from the sixth AND gate 102 remains at a high logic. The frequency division ratio of the third frequency divider 96 is determined by a ratio of the interval of unit block with respect to the interval corresponding to the sum of the width in a high logic of the space control signal $C_{SPC}$ and the width in a high logic of the stabilization information control signal $C_{VFO}$.

Figure 16:
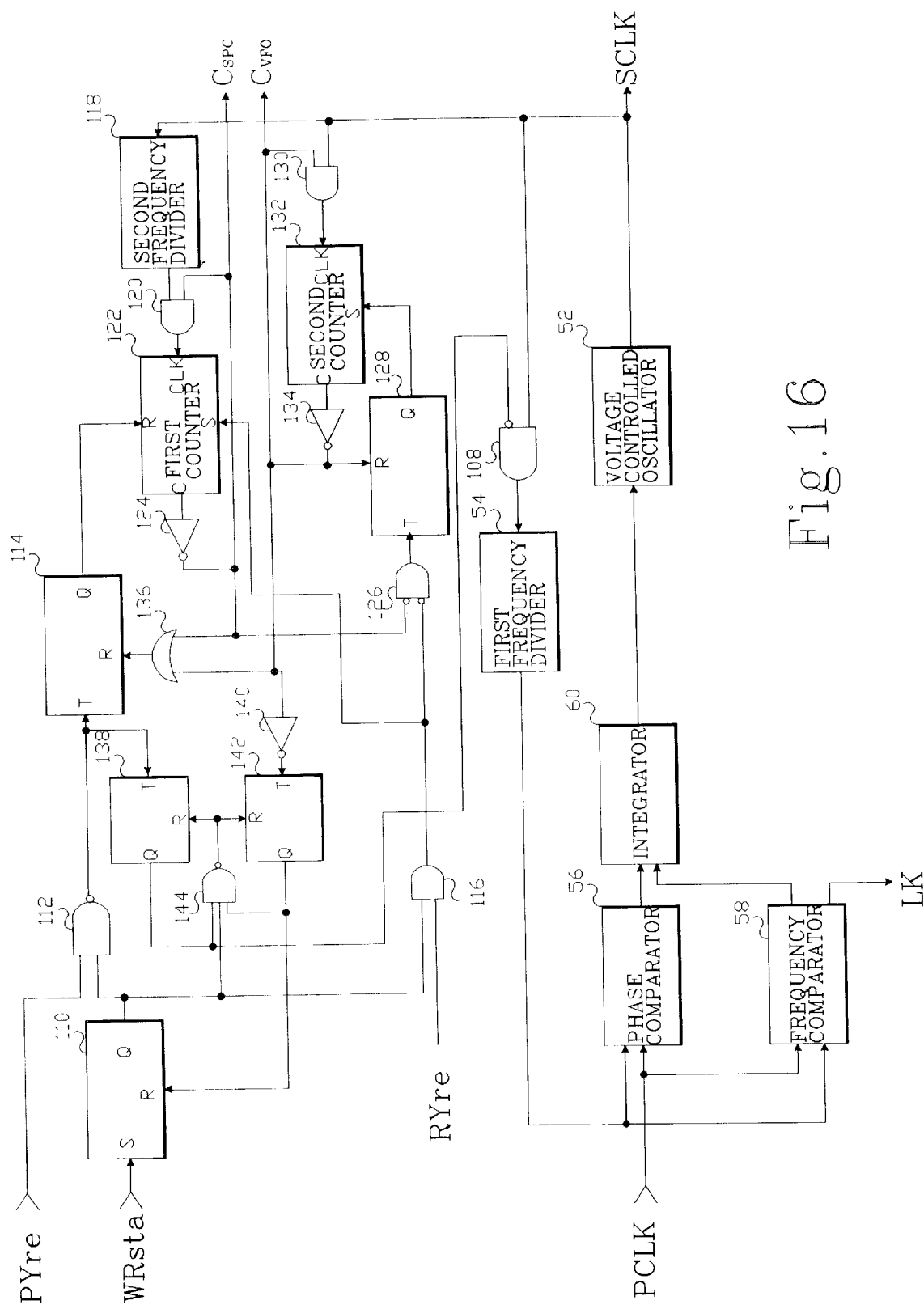
FIG. 16 is a detailed circuit diagram of the third embodiment of the adaptive reference clock generator shown in FIG. 8.

FIG. 16 is a detailed circuit diagram of the third embodiment of the adaptive reference clock generator 76 shown in FIG. 8. This adaptive reference clock generator 76 comprises the first frequency divider 54 for inputting a reference clock SCLK from a voltage controlled oscillator 52 via the first AND gate 108, and a phase comparator 56 and a frequency comparator 58 which input an output signal of the first frequency divider 54 commonly. The first AND gate 62 switches a reference clock SCLK in accordance with a switching control signal. Specifically, the first AND gate 108 allows a reference clock SCLK from the voltage controlled oscillator 52 not to be supplied to the first frequency divider 54 when the switching control signal remains at a high logic. In other words, the first AND gate 108 supplies the frequency divider 54 with a low logic signal. Accordingly, a low or high logic signal is generated also at the first frequency divider 52. At this time, the phase comparator 56 compares the phase of the support clock PCLK from the support signal decoder 36 shown in FIG. 8 with that of the logical signal from the first frequency divider 54 to thereby apply a phase error signal with a voltage signal increasing suddenly to an integrator 60. Also, the frequency comparator 58 comparing the frequency of the support clock PCLK with the logical signal from the first frequency divider 54 applies a frequency error signal having a voltage increasing suddenly to the integrator 60. The integrator 60 integrates the phase error signal from the phase comparator 56 and the frequency error signal from the frequency comparator 58, respectively, and eliminates noise signals of high frequency component included in these signals. The voltage controlled oscillator 52 raises the frequency of the reference clock SCLK suddenly from N times the frequency of the support clock PCLK to M times the frequency of the support clock PCLK in accordance with the phase error signal and the frequency error signal integrated from the integrator 60. As a result, the frequency of the reference clock SCLK rises suddenly from N times the frequency of the support clock PCLK to M times the frequency thereof at the rising edge of the switching control signal, and then maintains M times the frequency of the support clock PCLK until the falling edge of the switching control signal. Otherwise, if the switching control signal remains at a low logic, then the first AND gate 108 allows the reference clock SCLK from the voltage controlled oscillator 52 to be applied to the first frequency divider 54. In this case, the first frequency divider 54 makes an N frequency division of the reference clock SCLK from the first AND gate 108. At this time, the phase comparator 56 generates a phase error signal having a voltage signal decreasing gradually in accordance with a phase difference between the frequency-divided clock signal from the frequency divider 54 and the support clock PCLK. Likewise, the frequency comparator 58 generates a frequency error signal having a voltage decreasing gradually in accordance with a frequency difference between the clock signal from the first frequency divider 54 and the support clock PCLK. Subsequently, the voltage controlled oscillator 52 inputting both the phase error signal and the frequency error signal via the integrator 60 reduces the frequency of the reference clock SCLK gradually from M times the frequency of the support clock PCLK to N times the frequency thereof. Accordingly, the frequency of the reference clock SCLK becomes to be reduced gradually from M times the frequency of the support clock to N times the frequency thereof during a certain time interval from the falling edge of the switching control signal, for example, during a time interval corresponding to a range from the end position of the region in the signal track 20 or 22 on which the clock stabilization information is recorded to the end position of the unit block on which clock stabilization information is recorded. Also, this reference clock SCLK is applied to the VFO signal generator 44 and the recording information processor 46 as shown in FIG. 8. Further, the frequency comparator 58 can generate a locking signal LK having a specific logic, i.e., a high logic in the case where the frequency of the frequency-divided reference clock has a certain difference from that of the support clock PCLK, that is, where the frequency of the reference clock SCLK has N times to M times the frequency of the support clock PCLK. This locking signal LK is supplied to the control 50 shown in FIG. 8.

Figure 12:
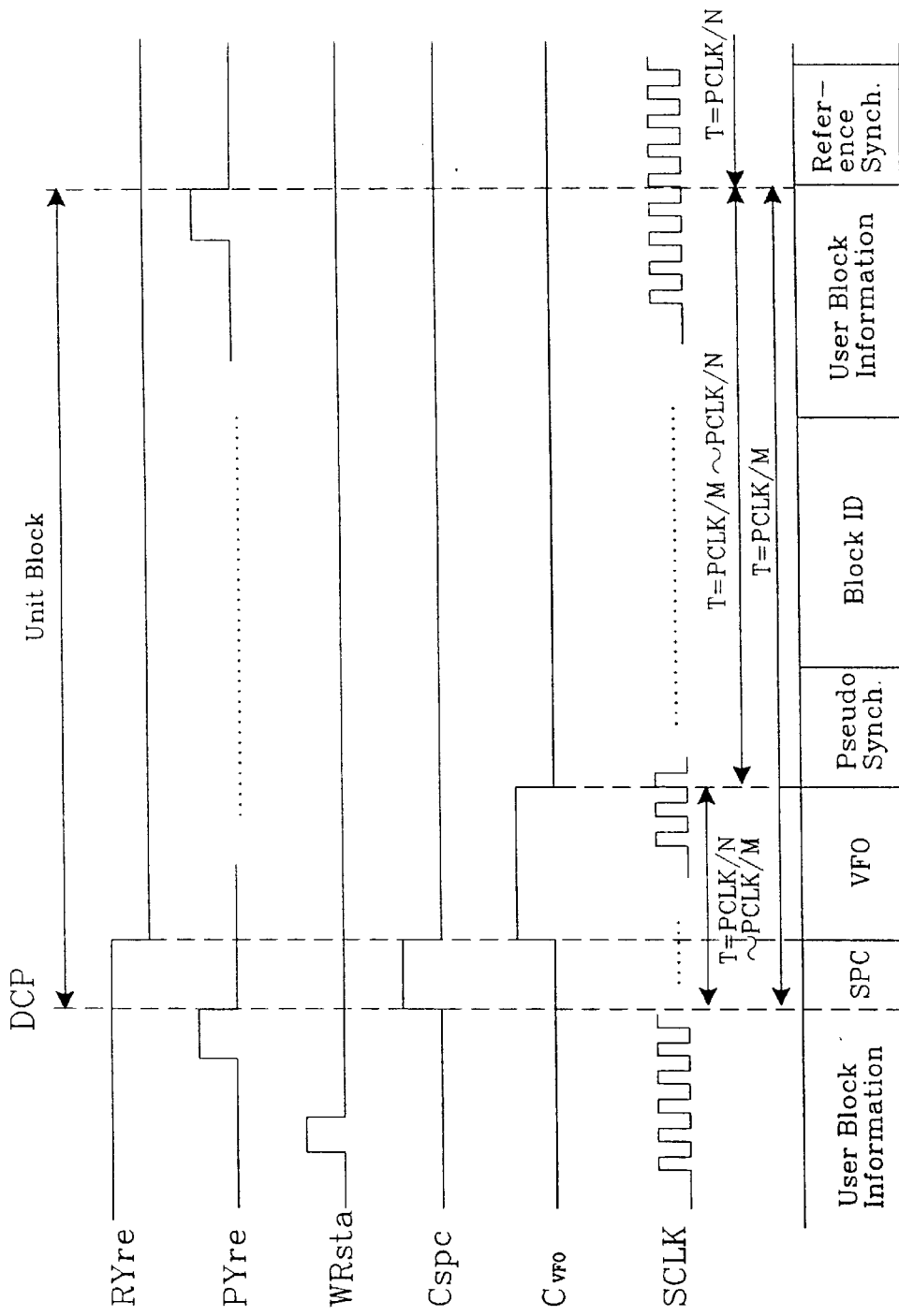

Further, the adaptive reference clock generator 76 includes the first latch 110 inputting a recording start signal $WR_{sta}$ as shown in FIGS. 10 to 12, a NAND gate 112 inputting a support synchronous signal PYre from the support signal decoder 36 shown in FIG. 8, and the second AND gate 116 inputting a reproducing synchronous signal RYre from the reproducing signal processor 51 shown in FIG. 8. The first latch 110 generates an output signal of high logic at an output terminal Q thereof when the recording start signal $WR_{sta}$ with a high logic is inputted to a set terminal S thereof. The NAND gate 112 provides a NAND operation of the output signal of the first latch 110 and the support synchronous signal PYre and selectively toggles the second latch 114 in accordance with the operated resultant value. Specifically, the NAND gate 112 generates a low logic of pulse only when either of the output signal of the first latch 110 and the support synchronous signal PYre remain at a high logic. The second latch 114 changes a logical signal at an output terminal Q thereof from a low logic to a high logic, at the rising edge of the low logic pulse from the NAND gate 112. Meanwhile, the second AND gate 116 makes a AND operation of the output signal of the first latch 110 and the reproducing synchronous signal RYre and passes through the reproducing synchronous signal RYre only when the output signal of the first latch 110 remains at a high logic, that is, when the first order user information block is recorded on the signal track 20 or 22 of the optical disc 24 at the time of starting the recording.

Furthermore, the adaptive reference clock generator 76 includes the second frequency divider 118 and the third AND gate 120 which are connected to the voltage controlled oscillator 52 in serial, the first counter 122, and the first inverter 124. The second frequency divider 118 frequency-divides the reference clock SCLK from the voltage controlled oscillator 52 by a constant frequency division ratio N and supplies the frequency-divided reference clock to the third AND gate 120. The third AND gate 120 delivers the frequency-divided reference clock the second frequency divider into a clock terminal CLK of the first counter 122 only when the space control signal $C_{SPC}$ remains at a specific logic, i.e., a high logic. The first counter 122 increments by the frequency-divided reference clock supplied from the third AND gate 120 during the time when a high logic signal is applied from the second latch 114 to the reset terminal R thereof. The first counter 122 generates a high logic of carry signal when the count value arrives at "L". Further, the first counter 122 becomes to stop the counting operation by a low logic signal applied from the second latch 114 to the reset terminal R thereof after generating the carry signal. Otherwise, the first counter 122 can generate a specific logic, for example, a high logic, in the case where a low logic of reproducing synchronous signal RYre is inputted from the second AND gate 116, that is, an end point of the first order reproducing synchronous signal RYre. Accordingly, the carry signal generated at the first counter 122 remains at only a high logic, or has a grounding logic, i.e., low logic of pulse with the certain width from a end point of the support synchronous signal PYre, that is, the width less than or equal to the time period of N×L reference clocks. The first inverter 124 inverts the carry signal from the first counter 122 and supplies the inverted signal to both the third AND gate 120 and the second control switch SW2 shown in FIG. 8 as a space control signal $C_{SPC}$. This space control signal $C_{SPC}$ becomes selectively to have a specific logic, i.e., a high logic in accordance with the operation mode of the first counter 122, that is, the order relationship of the phase of the reproducing synchronous signal RYre with that of the support synchronous signal PYre. Specifically, as shown in FIGS. 10 and 11, the space control signal $C_{SPC}$ maintains a grounding logic, i.e., a low logic when the support synchronous signal PYre is terminated, after the reproducing synchronous signal RYre. In this case, any space regions become not to be produced in the signal track 20 or 22 of the optical disc 24. On the other hand, when the reproducing synchronous signal RYre is terminated more lately than the end point of the support synchronous signal PYre as shown in FIG. 12, the space control signal $C_{SPC}$ becomes to have a specific logic of pulse. At this time, the pulse of the space control signal $C_{SPC}$ has a width corresponding to the time interval extending from the end point of the support synchronous signal PYre to the end point of the reproducing synchronous signal RYre. In the case where a specific logic of pulse exists in the space control signal $C_{SPC}$ as mentioned above, a space region spc corresponding to the width of the specific logic of pulse becomes to be produced in the signal track 20 or 22 of the optical disc 24.

Moreover, the adaptive reference clock generator 76 further comprises the fourth AND gate and the third latch 128 which are connected to an output terminal of the second AND gate 116 in serial, and the fifth AND gate 126, the second counter 132 and the second inverter 134 all of which are connected to the voltage controlled oscillator 52. The fourth AND gate 126 makes an AND operation of the space control signal $C_{SPC}$ from the first inverter 124 and an output signal from the second AND gate 116 and toggles the third latch 128 in accordance with the operated result. Specifically, the fourth AND gate 126 toggles the third latch 128 at the falling edge of the space control signal $C_{SPC}$, that is, at the end point of the space control signal $C_{SPC}$, or at the falling edge of the output signal of the second AND gate 116, that is, at the end point of the first order reproducing synchronous signal RYre. At this time, an output signal of the third latch 128 becomes to change from a low logic into a high logic. The fifth AND gate 130 delivers the reference clock SCLK from the voltage controlled oscillator 52 into the clock terminal CLK of the second counter 132 only when the stabilization information control signal $C_{VFO}$ remains at a specific logic, i.e., a high logic. The second counter 132 increments by the reference clock SCLK supplied from the fifth AND gate 130 when a high logic signal is applied from the third latch 128 to a reset terminal R thereof. Also, the second counter 132 generates a high logic of carry signal when the count value thereof arrives at "K". Subsequently, the second counter 132 becomes to stop the counting operation by a low logic signal supplied from the third latch 128 to the reset terminal R thereof after generating the carry signal. The second inverter 134 inverts the carry signal from the second counter 132 and supplies the inverted carry signal the fifth AND gate 130, the third latch 128, and the first control switch SW1 and the pseudo synchronous signal generator 42 as shown in FIG. 8, as a stabilization information control signal $C_{VFO}$. This stabilization information control signal $C_{VFO}$ becomes to maintain a specific logic, i.e., a high logic during a certain time interval from the end point of the space control signal $C_{SPC}$ in the case where a specific logic pulse is included in the space control signal $C_{SPC}$ as shown in FIG. 12. On the other hand, in the case where a specific logic of pulse is not included in the space control signal $C_{SPC}$ as shown in FIGS. 10 and 11, the stabilization information control signal $C_{VFO}$ maintains a high logic during a certain time interval from the falling edge of the first order reproducing synchronous signal RYre, that is, from the end point thereof. Accordingly, the third latch 128 is initialized by a grounding logic, i.e., low logic of stabilization information control signal $C_{VFO}$ applied to the reset terminal R thereof.

Furthermore, the adaptive reference clock generator 76 includes the fourth latch 138 toggled by the output signal of the first NAND gate 112, and an OR gate 136 and the third inverter 140 commonly inputting the stabilization information control signal $C_{VFO}$. The OR gate 136 makes an OR operation of the space control signal $C_{SPC}$ and the stabilization information control signal $C_{VFO}$ and initializes an output signal of the second latch 114 in accordance with the operated result. In similar to the second latch 114, the fourth latch 138 changes a signal at the output terminal Q thereof from a low logic into a high logic at the rising edge of a low logic pulse from the first NAND gate 112, that is, at the end point of the first order support synchronous signal PYre at the time of starting the recording. Further, the fourth latch 138 supplies the output signal of its own to the first AND gate 108 and the second NAND gate 144 as a switching control signal. The third inverter 140 inverts the stabilization information control signal $C_{VFO}$ and applies the inverted stabilization information control signal to a toggle terminal T of the fifth latch 142. The fifth latch 142 generates a high logic signal at an output terminal Q thereof at the rising edge of the stabilization information control signal supplied from the third inverter 140 to the toggle terminal T thereof, that is, at the end point of the stabilization information control signal $C_{VFO}$. An output signal of the fifth latch 142 is supplied to the first latch 110 and the second NAND gate 144. The second NAND gate 144 makes an AND operation of an output signal of the first latch 110, an output signal of the fourth latch 138 and an output signal of the fifth latch 142 and generates a low logic of impulse. By this low logic impulse from the second NAND gate 144, the output signals of the first 110, the second 138 and the third latch 142 is initialized. Accordingly, the output signal of the first latch 110 remains at a high logic during the time interval extending from the rising edge of the recording start signal $WR_{sta}$, that is, from the start point of recording to the falling edge of the stabilization information control signal $C_{VFO}$. A switching control signal generated at the fourth latch 138 remains at a high logic during the time interval extending from the falling edge of the support synchronous signal PYre, that is, the end point thereof to the falling edge of the stabilization information control signal $C_{VFO}$, the end point thereof. On the other hand, an output signal of the fifth latch 142 becomes to have an impulse shape of high logic because the fifth latch 142 constitutes a circular loop along with the second NAND gate 144. Meanwhile, the first AND gate 108 switches a reference clock SCLK to be applied from the voltage controlled oscillator 52 to the first frequency divider 54 in accordance with the switching control signal. Specifically, the first AND gate 108 allows the reference clock SCLK from the voltage controlled oscillator 52 not to be supplied to the first frequency divider 54 when the switching control signal maintains a high logic. On the other hand, when the switching control signal remains at a low logic, the first AND gate allows the reference clock SCLK to be supplied to the first frequency divider 54.

Figure 17:
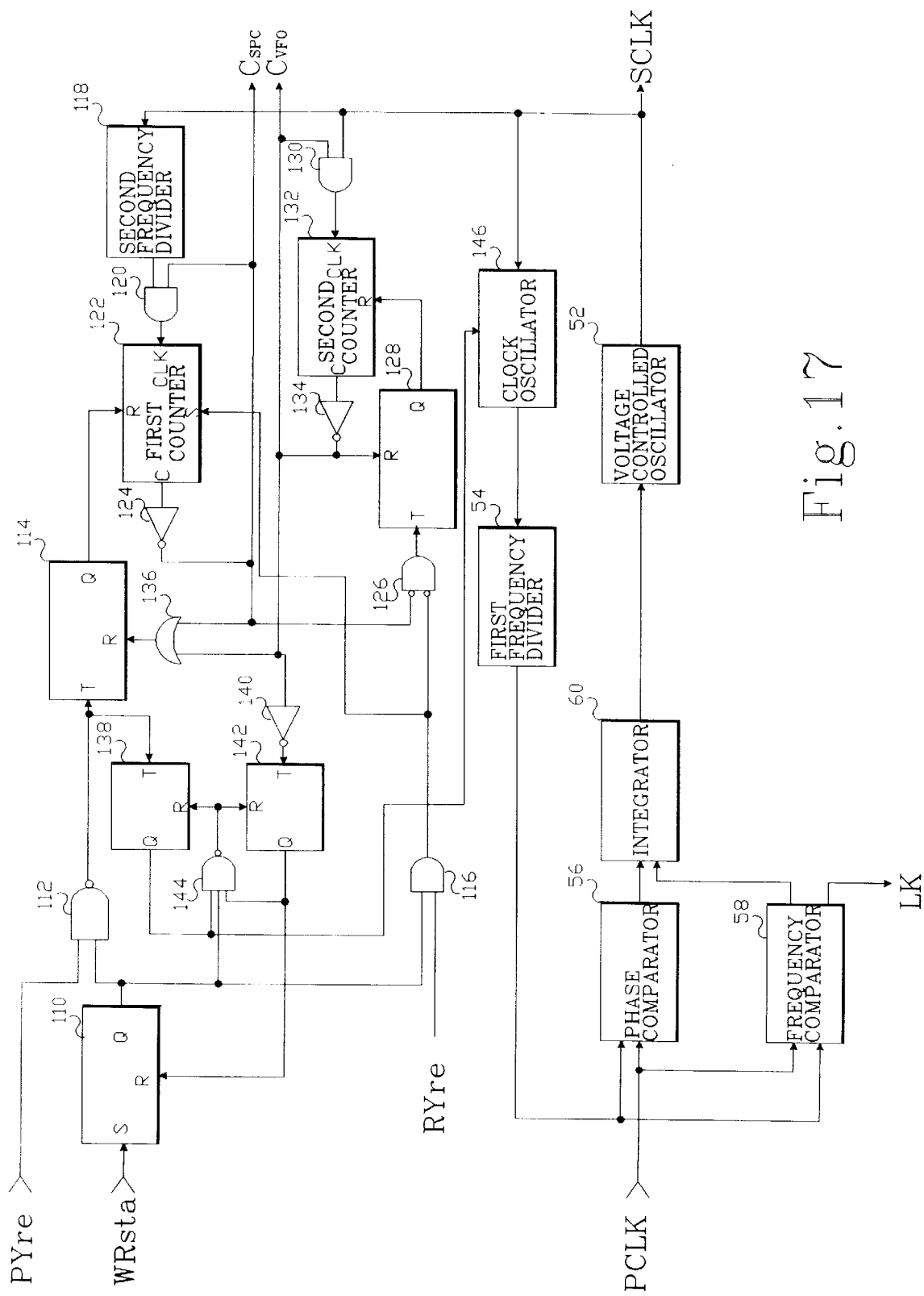
FIG. 17 is a detailed circuit diagram of the fourth embodiment of the adaptive reference clock generator shown in FIG. 8.

FIG. 17 is a detailed circuit diagram of the fourth embodiment of the adaptive reference clock generator 76 shown in FIG. 8. The adaptive reference clock generator 76 shown in FIG. 8 has the same circuit configuration as the adaptive reference clock generator 76 shown in the third embodiment shown in FIG. 16, except that the first AND gate 108 is replaced by the clock controller 146. This clock controller 146 allows the frequency of the reference clock SCLK to maintain M times the frequency of the support clock PCLK constantly during a certain time interval from the time point at which a switching control signal is enabled, for example, during a time interval corresponding to a range from the discontinuous recording position DCP to the end position of a single unit block. To this end, the clock controller 146 eliminates the reference clock SCLK transferred from the voltage controlled oscillator 52 one by one every constant time period during a time interval corresponding to a single unit block, after the switching control signal was changed from a low logic to a high logic. In this case, a phase error signal generated at the phase comparator 56 and a frequency error signal generated at the frequency comparator 58 are alternately increased and decreased. Accordingly, the voltage controlled oscillator 52 responsive to the phase error signal and the frequency error signal allows the phase of the reference clock SCLK to be identical to the phase of the support clock PCLK and at the same time the frequency of the reference clock SCLK to maintain M times the frequency of the support clock PCLK, by controlling the phase and frequency of the reference clock SCLK. Further, the clock controller 146 can implemented by removing the OR gate 92 inputting the stabilization information control signal $C_{VFO}$ and the space control signal $C_{SPC}$ in circuit devices of the clock controller 90 shown in FIG. 15 and by allowing the switching control signal to be supplied from the fourth latch 138.

As described above, in the present invention, clock stabilization information is recorded along with a user information on the block regions adjacent to a discontinuous recording position in the signal track of the optical disc on which a support signal is preformatted in a separated area different from the signal track. Accordingly, a user information recorded in the block regions adjacent to the discontinuous recording position in the signal track can be not only reproduced stabbly, but also a recording capacity of the optical disc can be enlarged. Also, according to the present invention, a space region is selectively produced between the discontinuous recording position in the signal track of the optical disc and the clock stabilization information in accordance with the order relationship of a reproducing synchronous signal with a support synchronous signal included in the support signal. As a result, the clock stabilization information becomes to be recorded in the block regions adjacent to the discontinuous recording position in synchronization with the reproducing synchronous signal. Furthermore, according to the present invention it becomes possible to maintain a recording capacity of the optical disc constantly and at the same time minimize an occurrence of error, by recording an information on the optical disc only when a reference clock is synchronized with the support clock included in the support signal.

Although the present invention has been explained by the embodiments shown in the drawing hereinbefore, it should be understood to the ordinary skilled person in the art that the invention is not limited to the embodiments, but rather than that various changes or modifications thereof are possible without departing from the spirit of the invention. Accordingly, the scope of the invention shall be determined only by the appended claims and their legal equivalents.

What is claimed is:

1. An optical disc recording method which comprises the steps of:
   detecting a support synchronous signal that divides a signal track of an optical disc into unit blocks on which a support signal is preformatted, said support signal including the support synchronous signal;
   recording clock stabilization information on a portion of a unit block that is adjacent to a discontinuous recording position in the signal track of the optical disc by utilizing said support synchronous signal; and
   recording user information on a remaining portion of said unit block by utilizing said support synchronous signal.

2. An optical disc recording method as set forth in claim 1, wherein said clock stabilization information is recorded on the signal track in such a manner that a space exists between said clock stabilization information and said discontinuous recording positions.

3. An optical disc recording method as set forth in claim 1, wherein said clock stabilization information includes a clock signal with a constant frequency.

4. An optical disc recording method as set forth in claim 1 which further comprises:
   sequentially recording the user information on unit blocks arranged next to the unit block adjacent to said discontinuous recording position.

5. An optical disc recording method as set forth in claim 4, wherein the user information recorded on the unit block adjacent to said discontinuous recording position includes a clock signal having a higher frequency compared with the user information recorded on the following unit blocks.

6. An optical disc recording method which comprises the steps of:
   detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
   recording a clock stabilization information on a portion of unit blocks adjacent to a discontinuous recording position in the signal track of the optical disc by utilizing said support synchronous signal and said support clock; and
   recording a user information on the remaining portion of the unit blocks adjacent to said discontinuous recording position by utilizing said support synchronous signal and said support clock.

7. An optical disc recording method as set forth in claim 6, wherein said clock stabilization information is recorded in a region corresponding to time periods of a certain number of said support clocks from said discontinuous recording position.

8. An optical disc recording method as set forth in claim 7, wherein said clock stabilization information is detected by said support synchronous signal.

9. An optical disc recording method as set forth in claim 6, wherein said clock stabilization information is recorded such that a space exists between said clock stabilization information and said discontinuous recording position.

10. An optical disc recording method which comprises the steps of:
   detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
   generating a reference clock based on the detected support clock;
   recording a clock stabilization information on a portion of unit blocks adjacent to a discontinuous recording position in the signal track of the optical disc by utilizing said support synchronous signal and said support clock; and recording a user information on the remaining portion of the unit blocks adjacent to said discontinuous recording position by utilizing said support synchronous signal and said reference clock.

11. An optical disc recording method as set forth in claim 10 which further comprises the step of recording the user information on at least one following unit block successive to the unit blocks adjacent to said discontinuous recording position by said support synchronous signal and said reference clock.

12. An optical disc recording method as set forth in claim 11, wherein said reference clock maintains a first frequency when the user information is recorded on the unit blocks adjacent to said discontinuous recording position, and a second frequency when the user information is recorded on said at least one following unit block.

13. An optical disc recording method as set forth in claim 12, wherein said first frequency is set to have a higher value than said second frequency.

14. An optical disc recording method which comprises the steps of:
    detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
    generating a reference clock based on the detected support clock;
    reproducing a synchronous signal recorded on the signal track;
    recording a clock stabilization information on a portion of unit blocks adjacent to a discontinuous recording position in the signal track of the optical disc by utilizing said reproduced synchronous signal and said reference clock; and
    recording a user information on the remaining portion of the unit blocks adjacent to said discontinuous recording position by utilizing said clock stabilization information and said reference clock.

15. An optical disc recording method which comprises the steps of:
    detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
    generating a reference clock based on the detected support clock;
    reproducing a synchronous signal recorded on the signal track;
    recording a clock stabilization information on a portion of unit blocks adjacent to a discontinuous recording position in the signal track of the optical disc by utilizing said reproduced synchronous signal, said support synchronous signal and said reference clock; and
    recording a user information on the remaining portion of the unit blocks adjacent to said discontinuous recording position by utilizing said clock stabilization information and said reference clock.

16. An optical disc recording method which comprises the steps of:
    detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
    generating a reference clock based on the detected support clock;
    reproducing a synchronous signal recorded on the signal track;
    recording a clock stabilization information on a portion of unit blocks adjacent to a discontinuous recording position in the signal track of the optical disc by utilizing said reproduced synchronous signal, said support synchronous signal and said reference clock;
    generating a pseudo synchronous signal by said clock stabilization information; and
    recording a user information on the remaining portion of the unit blocks adjacent to said discontinuous recording position by utilizing said pseudo synchronous signal and said reference clock.

17. An optical disc recording method as set forth in claim 16, wherein said step of generating said clock stabilization information includes selectively generating a space between said discontinuous recording position and a position on which said clock stabilization information is to be recorded, in accordance with the sequence relationship of a phase of said support synchronous signal with a phase of said reproduced synchronous signal.

18. An optical disc recording method as set forth in claim 17, wherein said space is generated when the phase of said support synchronous signal advances the phase of said reproduced synchronous signal.

19. An optical disc recording method as set forth in claim 18, wherein said space has a width corresponding to a phase difference of said support synchronous signal with respect to said reproduced synchronous signal.

20. An optical disc recording method which comprises the steps of:
    detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
    generating a reference clock based on the detected support clock;
    generating a reference synchronous signal based on the detected support synchronous signal;
    reproducing a synchronous signal recorded on the signal track;
    recording a clock stabilization information on a portion of unit blocks adjacent to a discontinuous recording position in the signal track of the optical disc by utilizing said reproduced synchronous signal, said support synchronous signal and said reference clock;
    generating a pseudo synchronous signal by said clock stabilization information;
    recording a user information on the remaining portion of the unit blocks adjacent to said discontinuous recording position by utilizing said pseudo synchronous signal and said reference clock; and recording the user information on at least one following unit block successive to the unit blocks adjacent to said discontinuous recording position by utilizing said reference synchronous signal and said reference clock.

21. An optical disc recording method as set forth in claim 20, wherein said reference clock maintains a first frequency when the user information is recorded on the unit blocks adjacent to said discontinuous recording position, and a second frequency when the user information is recorded on said at least one following unit block, and wherein said second frequency is lower than said first frequency.

22. An optical disc recording method as set forth in claim 20, wherein said pseudo synchronous signal has a pulse with a shorter width than said reference synchronous signal.

23. An optical disc recording apparatus, comprising:
support synchronous signal detecting means for detecting a support synchronous signal that divides a signal track of the optical disc into unit blocks on which a support signal is preformatted, said support signal including the support synchronous signal;
first recording means for recording a clock stabilization information on a portion of a unit block adjacent to a discontinuous recording position in the signal track of the optical disc by utilizing said support synchronous signal from said support synchronous signal detecting means; and
second recording means for recording user information on a remaining portion of said unit block by utilizing said support synchronous signal from said support synchronous signal detecting means.

24. An optical disc recording apparatus as set forth in claim 23, wherein said clock stabilization information is recorded on the signal track in such a manner that it is distant from said discontinuous recording positions by a space region.

25. An optical disc recording apparatus as set forth in claim 23, wherein said clock stabilization information includes a clock signal with a constant frequency.

26. An optical disc recording apparatus as set forth in claim 23, wherein said second recording means further includes:
means for recording the user information on at least one unit block arranged next to the unit block adjacent to said discontinuous recording position.

27. An optical disc recording apparatus as set forth in claim 23, wherein the user information recorded on the unit blocks adjacent to said discontinuous recording position includes a clock signal having a higher frequency than the user information recorded on said at least one following unit block.

28. An optical disc recording apparatus, comprising:
support signal detecting means for detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
first recording means for recording a clock stabilization information on a portion of unit blocks adjacent to a discontinuous recording position in the signal track of the optical disc by utilizing said support synchronous signal and said support clock from said support signal detecting means; and
second recording means for recording a user information on the remaining portion of the unit blocks adjacent to said discontinuous recording position by utilizing said support synchronous signal and said support clock from said support signal detecting means.

29. An optical disc recording apparatus as set forth in claim 28, wherein said clock stabilization information is recorded on a region corresponding to time periods of a certain number of said support clocks from said discontinuous recording position.

30. An optical disc recording apparatus as set forth in claim 29, wherein said first recording means detects said discontinuous recording position by said support synchronous signal.

31. An optical disc recording apparatus as set forth in claim 28, wherein said first recording means records said clock stabilization information in such a manner that a space exists between said clock stabilization information and said discontinuous recording position.

32. An optical disc recording apparatus, comprising:
support signal detecting means for detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;
reference clock generating means for generating a reference clock based on said support clock from said support signal detecting means;
first recording means for recording a clock stabilization information on a portion of unit blocks adjacent to a discontinuous recording position in the signal track of the optical disc by utilizing said support synchronous signal from said support signal detecting means and said reference clock from said reference clock generating means; and
second recording means for recording a user information on the remaining portion of the unit blocks adjacent to said discontinuous recording position by utilizing said clock stabilization information from said first recording means and said reference clock from said reference clock generating means.

33. An optical disc recording apparatus as set forth in claim 32, wherein said second recording means records the user information on at least one following unit block successive to the unit blocks adjacent to said discontinuous recording position by said support synchronous signal from said support signal detecting means and said reference clock from said reference clock generating means.

34. An optical disc recording apparatus as set forth in claim 33, wherein said reference generating means allows said reference clock to maintain a first frequency when the user information is recorded on the unit blocks adjacent to said discontinuous recording position, and a second frequency when the user information is recorded on said at least one following unit block.

35. An optical disc recording apparatus as set forth in claim 34, wherein said first frequency is set to have a higher value than said second frequency.

36. An optical disc recording apparatus, comprising:
support signal detecting means for detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;

reference clock generating means for generating a reference clock based on the detected support clock from said support signal detecting means;

reproducing means for reproducing a synchronous signal recorded on the signal track;

first recording means for recording a clock stabilization information on a portion of unit blocks adjacent to a discontinuous recording position in the signal track of the optical disc by utilizing said reproduced synchronous signal from said reproducing means and said reference clock from said reference clock generating means; and second recording means for recording a user information on the remaining portion of the unit blocks adjacent to said discontinuous recording position by utilizing said clock stabilization information from said first recording means and said reference clock from said reference clock generating means.

37. An optical disc recording apparatus, comprising:

support signal detecting means for detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;

reference clock generating means for generating a reference clock based on said support clock from said support signal detecting means;

reproducing means for reproducing a synchronous signal recorded on the signal track;

first recording means for recording a clock stabilization information on a portion of unit blocks adjacent to a discontinuous recording position in the signal track of the optical disc by utilizing said reproduced synchronous signal from said reproducing means, said support synchronous signal from said support signal detecting means and said reference clock from said reference clock generating means; and second recording means for recording a user information on the remaining portion of the unit blocks adjacent to said discontinuous recording position by utilizing said clock stabilization information from said first recording means and said reference clock from said reference clock generating means.

38. An optical disc recording apparatus, comprising:

support signal detecting means for detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;

reference clock generating means for generating a reference clock based on said support clock from said support signal detecting means;

reproducing means for reproducing a synchronous signal recorded on the signal track;

first recording means for recording a clock stabilization information on a portion of unit blocks adjacent to a discontinuous recording position in the signal track of the optical disc by utilizing said support synchronous signal from said support signal detecting means, the reproduced synchronous signal from said reproducing means and said reference clock from said reference clock generating means;

pseudo synchronous signal generating means for generating a pseudo synchronous signal by said clock stabilization information from said first recording means; and second recording means for recording a user information on the remaining portion of the unit blocks adjacent to said discontinuous recording position by utilizing said pseudo synchronous signal from said pseudo synchronous signal generating means and said reference clock from said reference clock generating means.

39. An optical disc recording apparatus as set forth in claim 38, wherein said first recording means selectively generates a space between said discontinuous recording position and a position on which said clock stabilization information is to be recorded, in accordance with the sequence relationship of a phase of said support synchronous signal with a phase of said reproduced synchronous signal.

40. An optical disc recording apparatus as set forth in claim 39, wherein said first recording means allows said space to be produced on the signal track when the phase of said support synchronous signal advances the phase of said reproduced synchronous signal.

41. An optical disc recording apparatus as set forth in claim 40, wherein said space has a width corresponding to a phase difference of said support synchronous signal with respect to said reproduced synchronous signal.

42. An optical disc recording apparatus, comprising:

support signal detecting means for detecting a support synchronous signal for dividing a signal track into unit blocks and a support clock for indicating a transfer rate of an information from an optical disc on which a support signal is preformatted in a separate area different from the signal track, said support signal including the support synchronous signal and the support clock;

reference clock generating means for generating a reference clock based on said support clock from said support signal detecting means;

reference synchronous signal generating means for generating a reference synchronous signal based on said support clock from said support signal detecting means;

reproducing means for reproducing a synchronous signal recorded on the signal track;

first recording means for recording a clock stabilization information on a portion of unit blocks adjacent to a discontinuous recording position in the signal track of the optical disc by utilizing said support synchronous signal from said support signal detecting means, said reproduced synchronous signal from said reproducing means, and said reference clock from said reference clock generating means;

pseudo synchronous signal generating means for generating a pseudo synchronous signal by said clock stabilization information from said first recording means;

second recording means for recording a user information on the remaining portion of the unit blocks adjacent to said discontinuous recording position by utilizing said pseudo synchronous signal from said pseudo synchronous signal generating means and said reference clock from said reference clock generating means; and third recording means for recording the user information on at least one following unit block successive to the unit blocks adjacent to said discontinuous recording position by utilizing said reference synchronous signal from said reference synchronous signal generating means and said reference clock from said reference clock generating means.

43. An optical disc recording apparatus as set forth in claim 42, wherein said reference clock generating means allows said reference clock to maintain a first frequency when the user information is recorded on the unit blocks adjacent to said discontinuous recording position, and a second frequency when the user information is recorded on said at least one following unit block, and wherein said second frequency is lower than said first frequency.

44. An optical disc recording apparatus as set forth in claim 43, wherein said pseudo synchronous signal has a pulse with a shorter width than said reference synchronous signal.

* * * * *

UNITED STATES PATENT AND TRADEMARK OFFICE
CERTIFICATE OF CORRECTION

PATENT NO.   : 5,991,250
DATED        : November 23, 1999
INVENTOR(S)  : Dae Young Kim It is certified that error appears in the above-identified patent and that said Letters Patent is hereby corrected as shown below:

<u>Title page,</u>
Please insert Foreign Application Priority Data as follows:

-- [30]        Foreign Application Priority Data

July 23, 1996    (KR)     Korea . . . . . . . . . . . . . . 96-29776
   July 14, 1997    (KR)     Korea . . . . . . . . . . . . . . 97-32606 --.

Signed and Sealed this

First Day of July, 2003

JAMES E. ROGAN
*Director of the United States Patent and Trademark Office*